(12) United States Patent
Vojcic et al.

(10) Patent No.: US 9,509,341 B2
(45) Date of Patent: *Nov. 29, 2016

(54) SYSTEMS AND METHODS FOR ENCODING AND DECODING OF CHECK-IRREGULAR NON-SYSTEMATIC IRA CODES

(71) Applicant: Digital PowerRadio, LLC, Palm Beach, FL (US)

(72) Inventors: Branimir R Vojcic, Vienna, VA (US); Stylianos Papaharalabos, Maroussi (GR)

(73) Assignee: LN2 DB, LLC, Palm Beach, FL (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/607,043

(22) Filed: Jan. 27, 2015

(65) Prior Publication Data

US 2015/0207524 A1 Jul. 23, 2015

Related U.S. Application Data

(60) Continuation of application No. 14/052,440, filed on Oct. 11, 2013, now Pat. No. 8,943,383, which is a division of application No. 13/693,029, filed on Dec. 3, 2012, now Pat. No. 8,595,590.

(51) Int. Cl.
*H03M 13/00* (2006.01)
*H03M 13/11* (2006.01)
(Continued)

(52) U.S. Cl.
CPC ..... *H03M 13/1197* (2013.01); *H03M 13/1111* (2013.01); *H03M 13/255* (2013.01);
(Continued)

(58) Field of Classification Search
CPC ... H04L 1/0041; H04L 1/005; H04L 1/0057; H04L 1/0065; H04L 1/0071; H04L 1/08; H03M 13/00
USPC ........ 714/755, 758, 780, 794, 786; 375/262, 375/298, 265
See application file for complete search history.

(56) References Cited

U.S. PATENT DOCUMENTS

| | | | |
|---|---|---|---|
| 6,029,264 A | * | 2/2000 | Kobayashi ............ H03M 13/29 714/755 |
| 6,229,824 B1 | | 5/2001 | Marko |
| 8,943,383 B2 | * | 1/2015 | Vojcic ................... H04L 1/0041 714/755 |

OTHER PUBLICATIONS

Ten Brink S. et al., "Design of repeat-accumulate codes for iterative detection and decoding", IEEE Transactions on Signal Processing, vol. 51, No. 11 (Nov. 1, 2003).
(Continued)

*Primary Examiner* — Guy Lamarre
(74) *Attorney, Agent, or Firm* — Bryan Cave LLP

(57) ABSTRACT

Systems and methods for encoding and decoding check-irregular non-systematic IRA codes of messages in any communication or electronic system where capacity achieving coding is desired. According to these systems and methods, IRA coding strategies, including ones that employ capacity-approaching non-systematic IRA codes that are irregular and that exhibit a low error floor, are employed. These non-systematic IRA codes are particularly advantageous in scenarios in which up to half of coded bits could be lost due to channel impairments and/or where complementary coded bits are desired to transmit over two or more communications sub-channels. An encoder includes information bit repeaters and encoders, one or more interleavers, check node combiners, a check node by-pass and an accumulator. A decoder includes a demapper, one or more check node processors, an accumulator decoder, a bit decoder, and one or more interleavers/deinterleavers.

19 Claims, 30 Drawing Sheets

(51) Int. Cl.

| | | |
|---|---|---|
| *H04L 1/00* | (2006.01) | |
| *H03M 13/25* | (2006.01) | |
| *H03M 13/35* | (2006.01) | |
| *H03M 13/37* | (2006.01) | |
| *H03M 13/09* | (2006.01) | |
| *H03M 13/15* | (2006.01) | |
| *H03M 13/29* | (2006.01) | |

(52) U.S. Cl.
CPC ....... *H03M13/356* (2013.01); *H03M 13/3746* (2013.01); *H03M 13/611* (2013.01); *H03M 13/6362* (2013.01); *H04L 1/0041* (2013.01); *H03M 13/09* (2013.01); *H03M 13/098* (2013.01); *H03M 13/152* (2013.01); *H03M 13/296* (2013.01); *H03M 13/2906* (2013.01); *H03M 13/3761* (2013.01)

(56) References Cited

OTHER PUBLICATIONS

Park Sung IK et al., "Extended Hamming accumulate codes and modified irregular repeat accumulate coees", Electronics Letters, vol. 38, No. 10 (May 9, 2002).

Brian Kroeger et al., "Robust modem and coding techniques for FM hybrid IBOC DAB", IEEE Transactions on Broadcating, vol. 43, No. 4 (Dec. 1, 1997).

Kienle F et al., "Joint graph-decoder design of IRA codes on scalable architectures", Proc., IEEE International conference on Acoustics, Speech, and Signal Processing, ICASSP '04, Montreal Quebec Canada, vol. 4 (May 17, 2004-May 21, 2004).

Supplementary Partial European Search Report for EP Application No. 13860179.4, dated Jul. 12, 2016.

* cited by examiner

SYSTEMS AND METHODS FOR ENCODING AND DECODING OF CHECK-IRREGULAR NON-SYSTEMATIC IRA CODES

CROSS-REFERENCE TO RELATED APPLICATIONS

The present application is a continuation application of U.S. patent application Ser. No. 14/052,440 filed on Oct. 11, 2013, now U.S. Pat. No. 8,943,383, which is a divisional application of U.S. patent application Ser. No. 13/693,029 filed on Dec. 3, 2012, now U.S. Pat. No. 8,595,590, which is incorporated herein by reference in its entirety.

FIELD OF THE INVENTION

The present invention relates to systems and methods for encoding and decoding of messages in any communication system where capacity achieving coding is desired, including all-digital and hybrid digital radio (HD Radio or HDR) communications transmitters and receivers, as well as other wireless or wired communications systems.

BACKGROUND

Turbo and Low-Density Parity-Check (LDPC) codes are advanced Forward Error Correction (FEC) schemes. As the information-block size increases, their performance is known to approach the Shannon bound. As such, they are attractive in the design of modern wired and wireless communication systems, such as 3G cellular, Wi-Fi, Wi-MAX, DVB-x (–C2/T2/S2, –SH, –RCS/RCS2, –NGH), ADSL2+, and telemetry (CCSDS), as well as for the reliability of magnetic disks. In practice, LDPC codes can be implemented efficiently allowing for parallel decoding architectures and achieving high data throughputs. They could have better error correcting capabilities than turbo codes, especially for higher coding rates and larger block sizes. As known in the art, Irregular Repeat-Accumulate (IRA) codes are a class of LDPC codes that feature lower encoding complexity than general LDPC codes, with comparable error rate performance.

It is commonly perceived in the field that these capacity achieving codes (e.g., turbo, LDPC, and IRA) would need to be systematic to enable their convergence at low signal-to-noise ratios. In systematic codes, the information bits are transmitted over the channel together with the coded or parity bits. The ratio of the number of information to the number of parity bits depends on the coding rate (R). In non-systematic codes, information bits are not transmitted but only the coded bits. Until recently, there is a scarcity of work on non-systematic capacity-achieving codes. However, it should be noted that in certain prior art systems, non-systematic IRA codes may perform as well as systematic IRA codes. Importantly, non-systematic capacity-achieving codes may have significant advantages over the systematic ones in some communication scenarios.

Typical scenarios in which non-systematic codes are preferable against systematic codes are: (i) strong interference or other channel impairments present over a fraction of received coded bit stream; (ii) satellite diversity (when the signal from one satellite is lost due to severe shadowing or multipath fading); (iii) MIMO transmission, or transmit diversity in general (e.g., signal transmission from two or more sites or antennas, or multiple signal transmissions in time or frequency); and (iv) Hybrid Automatic Repeat Request (HARQ or Hybrid ARQ) systems (where packet retransmissions could employ fully complementary coded bits).

For example, in a system with a dual-satellite diversity, such as Sirius satellite digital radio system, e.g., where the same information packet is transmitted from two satellites, it is desirable to implement complementary coding over two satellite coded symbol streams such that each stream has a coding rate R but the combined signal from the two streams has a coding rate R/2. This could be readily accomplished with a non-systematic code by employing complementary puncturing of the coded stream of rate R/2 to obtain two complementary coded streams each of rate R. Thus, when the signals from both satellites are received, effectively a combined signal with powerful FEC is received. If the signal from one of the satellites is faded or obstructed by trees or buildings, the signal from the other satellite is still protected by a FEC code of rate R. With systematic capacity-achieving codes, complementary coding and combining is not effective because typically all systematic bits need to be repeated in both streams and only the parity bits could be complementary, thus resulting in less efficient FEC protection in the combined signal. It would be apparent to one skilled in the art that similar reasoning for why systematic codes may not be desirable in other aforementioned communications scenarios, including the ones mentioned above. Thus, there is a need for capacity-approaching non-systematic codes with low error floors, including improved IRA coding strategies.

A design of a non-systematic IRA code was presented in S. ten Brink, and G. Kramer, "Design of Repeat—Accumulate Codes for Iterative Detection and Decoding," IEEE Trans. on Signal Processing, Vol. 51, No. 11, pp. 2764-2772, November 2003 for code rate R=½ only, assuming Binary Phase-Shift Keying (BPSK) modulation. The non-systematic IRA code of S. ten Brink et al. method had a bi-regular check-node structure, a subset of check nodes of degree 1, i.e., also referred as to check by-pass, for doping, and remaining check nodes of degree 3, also referred to as check combiners of degree 3. The check combiners of degree n perform modulo-2 addition of n input bits represented in {0,1} domain. One of the disadvantages of the IRA code in S. ten Brink et al. method is that the code exhibits a relatively high error floor, due to a relatively large fraction of low degree bit-repetition nodes. In addition, a very large number of iterations is required to achieve convergence. Certain codes that exhibit improved error floors may be achieved by replacing a fraction of degree 2 bit nodes with a linear block code, such as Hamming (8,4) block code, as is the case for the IRA code in S. I. Park, and K. Yang, "Extended Hamming Accumulate Codes and Modified Irregular Repeat Accumulate Codes", IEE Electronics Letters, Vol. 38, No. 10, pp. 467-468, May 2002. The IRA code in Park et al. method is a check regular code with check-node degree of 3. However, experimental simulation results have shown that check-regular non-systematic IRA codes such as the ones from Park et al. do not converge in many cases.

Thus, there is a further need for improved IRA coding strategies, including ones that employ capacity-approaching non-systematic IRA codes that are irregular and that exhibit a low error floor.

SUMMARY

According to certain embodiments, methods and systems are provided to encode and decode irregular non-systematic IRA codes, i.e., ones that contain a certain fraction of check nodes of degree 1 to help initiate iterative decoding and some other check nodes of higher degrees, e.g., degrees 3 and 4. In addition to improving the decoding convergence rate and the error floor, the check irregular non-systematic IRA codes described herein preferably also provide extra flexibility in designing a variety of desired FEC rates by having the freedom to vary both the bit and check nodes degrees. The IRA codes also perform very well with a moderate number of iterations.

The advantages of certain aspects and embodiments are demonstrated in the following sections on the examples of $R=\frac{1}{3}$ and $R=\frac{5}{12}$ code rates and different modulations, such as Binary Phase Shift Keying (BPSK) and 64-Quadrature Amplitude Modulation (64-QAM), without loss of generality.

As explained earlier, with non-systematic codes, separate high-coding-rate codes from the same encoder can be combined appropriately in a complementary manner at the receiver resulting in a lower coding rate code. For instance, the combination of two non-systematic, complementary, $R=\frac{4}{5}$ codes results in $R=\frac{4}{10}=\frac{2}{5}$ non-systematic code, and thus a more powerful code is formed at the receiver. However, this is not the case for systematic codes, such as the systematic turbo and LDPC codes known in the field. In these cases, the combination of two systematic $R=\frac{4}{5}$ codes would result in $R=\frac{4}{6}=\frac{2}{3}$ systematic code, assuming that systematic bits are repeated in both component codes, which is necessary because the puncturing of systematic bits results in significant performance degradation. Thus, the performance of a combined signal stream is expected to be degraded with respect to the corresponding $R=\frac{2}{5}$ non-systematic code. For this reason, non-systematic IRA codes are of particular importance since, when combined properly at the receiver, they result in a more powerful code having a lower equivalent code rate. This makes the design of non-systematic IRA codes being of practical importance since: (i) it allows for appropriate combination of higher rate codes resulting in a more powerful lower rate code; and (ii) the decoder is still able to operate with only one higher rate code received, in case the other is lost.

In some embodiments, the check-irregular non-systematic IRA code is used with complementary puncturing to improve the performance of HD Radio (HDR) digital broadcasting system. Hybrid HDR is a system for terrestrial digital radio broadcasting in which analog AM/FM and digital radio signals are simultaneously transmitted, based on Orthogonal Frequency Division Multiplexing (OFDM), wherein the digital signal is transmitted in sub-bands on both sides of the analog host signal at a low power level. In all-digital HDR systems, only digital OFDM subcarriers are transmitted but upper and lower sidebands could still experience different channel impairments. Due to frequency selective multipath fading and possibly Adjacent Channel Interference (ACI), the signal in one of the side-bands could be significantly corrupted. It is apparent that some receivers may lose one side-band, after channel distortions, and HDR systems employ complementary puncturing/coding, using convolutional codes, over two side bands to enable most efficient decoding with and without loss of one side-band. However, the convolutional codes in HDR systems, and concatenated convolutional and Reed-Solomon codes in some cases, operate far from the channel capacity. In some cases, they perform unsatisfactorily. Therefore, the performance of HDR systems is improved by employing more efficient FEC coding, consistent with the principles of the invention.

In some embodiments, the check-irregular non-systematic IRA code is employed instead of the FEC codes for hybrid (i.e., analog and digital) AM HDR. In other embodiments, the check-irregular non-systematic IRA code is employed to improve the performance of hybrid FM HDR. In some embodiments, the check-irregular non-systematic IRA code is applied to all-digital AM HDR. In yet other embodiments, the check-irregular non-systematic IRA code is applied to all-digital FM HDR.

In some embodiments, the check-irregular non-systematic IRA code is advantageously employed in multi-antenna systems such as SIMO, MISO, and MIMO.

In yet other embodiment, the check-irregular non-systematic IRA code is advantageously employed in HARQ systems with full complementary coded retransmissions.

The methods and systems described herein may rely on information bit repeaters, one or more interleavers, check node combiners, a check node by-pass and an accumulator to encode check-irregular non-systematic irregular repeat accumulate codes and one or more modulation mappers, and could be used in different communications systems including AM or FM, all-digital or hybrid, HD Radio systems. The information bit repeaters produce a first stage of coded bits which are interleaved. The check node combiners are of different degrees greater than or equal to 2, and at least one of them includes one or more modulo-2 adders. The check node by-pass passes the set of first stage coded bits to a further encoding stage which the accumulator encodes along with the output from the check node bypass. The accumulator may be replaced with a convolutional code of $R=1$ with a larger memory order. An outer encoder may encode at least some information bits before the first stage encoding. Less significant source bits may be directed to less error resilient positions, while more significant source bits are directed to other higher-degree bit repeaters.

Similarly, these methods and systems may rely on a demapper, one or more check node processors, an accumulator decoder, a bit decoder, and one or more interleavers/deinterleavers to decode check-irregular non-systematic irregular repeat accumulate codes, and could be used in different communications systems including AM or FM, all-digital or hybrid, HD Radio systems. One or more demappers are used to soft-demodulate a received noisy symbol sequence to produce Log-Likelihood Ratios of third stage coded bits. The check node processors produce outgoing messages corresponding to a first stage coded bits from the incoming messages and from a priori information (e.g., interleaved extrinsic information), and produce extrinsic information for the second stage coded bits that are passed to an accumulator decoder as a priori information for the second stage coded bits. The accumulator decoder produces soft bits, outgoing messages corresponding to the second stage coded bits obtained from Log-Likelihood Ratios of the third stage coded bits and a priori information corresponding to the second stage coded bits. The bit decoder processes deinterleaved updated incoming messages corresponding to the first stage coded bits to produce extrinsic information for the first stage coded bits and information bits soft outputs. The interleaver/deinterleaver interleave the extrinsic information for the first stage coded bits, and deinterleave outgoing messages corresponding to the first stage coded bits, respectively. One or more bit interleavers (e.g., rectangular interleavers) may be included between the accumulator and one or more symbol mappers.

Other benefits and features of the present invention may become apparent from the following detailed description considered in conjunction with the accompanying drawings.

It is to be understood, however, that the drawings are designed solely for purposes of illustration and not as a definition of the limits of the invention, for which reference should be made to the appended claims.

BRIEF DESCRIPTION OF THE DRAWINGS

Further features of the invention, its nature and various advantages will be more apparent from the following detailed description of the embodiments, taken in conjunction with the accompanying drawings in which:

FIG. 5(a) illustrates performance in terms of the bit error rate while FIG. 5(b) illustrates performance in terms of the frame error rate;

FIG. 6(a) illustrates performance in terms of the bit error rate while FIG. 6(b) illustrates performance in terms of the frame error rate;

FIG. 10(a) illustrates performance in terms of the bit error rate while FIG. 10(b) illustrates performance in terms of the frame error rate;

FIG. 11(a) illustrates performance in terms of the bit error rate while FIG. 11(b) illustrates performance in terms of the frame error rate;

FIG. 14(a) illustrates performance in terms of the bit error rate while FIG. 14(b) illustrates performance in terms of the frame error rate;

FIG. 15(a) illustrates performance in terms of the bit error rate while FIG. 15(b) illustrates performance in terms of the frame error rate;

FIG. 16(a) illustrates performance in terms of the bit error rate while FIG. 16(b) illustrates performance in terms of the frame error rate;

FIG. 18(a) illustrates performance in terms of the bit error rate while FIG. 18(b) illustrates performance in terms of the frame error rate. Time diversity separation for convolutional code is equal to 3 seconds;

FIG. 19(a) illustrates performance in terms of the bit error rate while FIG. 19(b) illustrates performance in terms of the frame error rate. Time diversity separation for convolutional code is equal to 3 seconds; FIG. 19(a) illustrates performance in terms of the bit error rate while FIG. 19(b) illustrates performance in terms of the frame error rate. Time diversity separation for convolutional code is equal to 4.5 seconds.

DETAILED DESCRIPTION OF PREFERRED EMBODIMENTS

Check-Irregular Non-Systematic IRA Encoder and Transmitter

Figure 1:
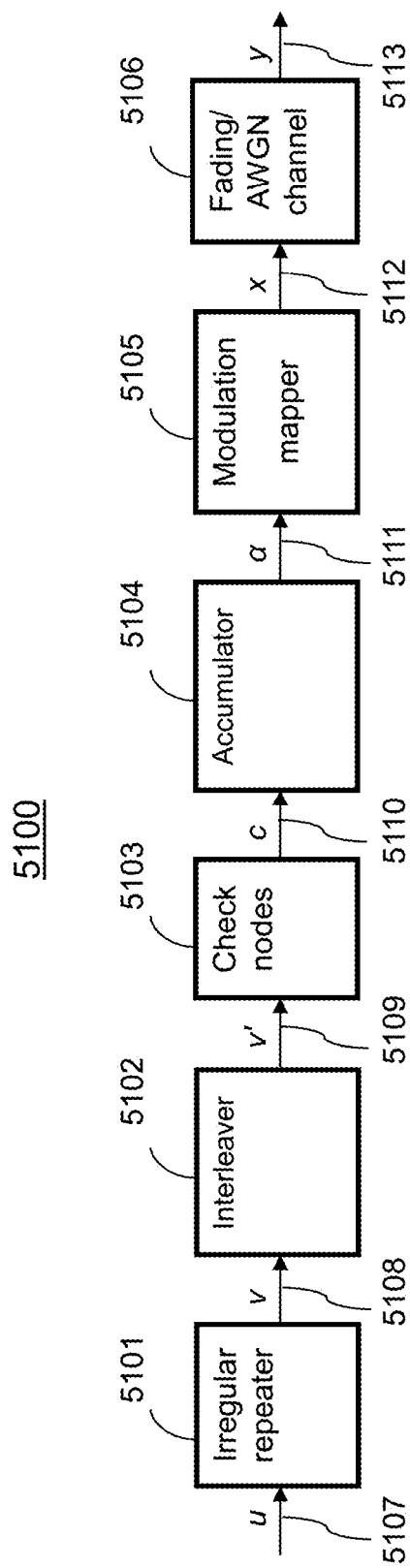
FIG. 1 is a simplified block diagram of a transmitter employing an IRA encoder.

A typical, simplified transmitter with a check-irregular non-systematic IRA encoder is shown in FIG. 1 in accordance with certain embodiments. The transmitter 5100 includes a set of bit repeaters, also referred to as bit repeater nodes, of different degrees, collectively referred to as irregular bit repeater 5101 that repeats the information bits sequence u on line 5107 in an irregular fashion. For example, a bit repeater of degree m produces m identical replicas of an information bit, as known in the art. These repeated information bits represent the first stage coded bits. An interleaver 5102 performs pseudo-random permutations on the repeated bits sequence v on line 5108, and produces interleaved first stage coded bits v' on line 5109.

A set of check node combiners of different degrees, collectively referred to as check nodes 5103 operate on the interleaver output v' on line 5109 to produce the second stage coded bits, check bits sequence c on line 5110. A check node combiner of degree n performs modulo-2 addition of n inputs bits represented in {0,1} domain, a check node of degree 1 is a by-pass check node, or simply a check by-pass, that simply passes the input bits to the output. The second stage coded bits are processed by an accumulator 5104, which is just a differential encoder, producing the third stage coded bits, coded bits sequence α on line 5111. Then, the third stage coded bits on line 5111 are transformed into modulation symbols using a desired modulation mapping, such as BPSK, QPSK, M-QAM, or other desired modulation mappings, in block 5105 producing modulation symbols x on line 5112 to be transmitted over a channel 5106. For simplicity, an equivalent baseband model is considered here, omitting steps such as carrier modulation, power amplifications and other steps as known in the art. The channel may include additive white Gaussian noise (AWGN), multiplicative fading, or other forms of multipath fading, and possible impulsive and other interference. Finally, the sequence y on line 5113 is the received baseband signal, including the transmitted symbols x distorted by various channel impairments mentioned above. The received signal in one symbol interval, after commonly known processing in the art for the receiver and particularly after demodulator sampling, could be represented as $$y_k = A_k x_k + n_k + w_k \quad (1)$$

In (1), $x_k$ represents the transmitted modulation symbol in the k-th symbol interval, $A_k$ represents the amplitude of a multiplicative distortion, such as fading, $n_k$ represents the complex white Gaussian noise with variance $\sigma^2$ in in-phase (I) and Quadrature (Q) channels, and $w_k$ represents possible interference, which will be ignored in further equations for simplicity. Each modulation symbol $x_k$ is composed of m information bits, where $m = \log_2(M)$, $\{x_k(j)\}$, $j=1, \ldots, m$ with M being the modulation order.

In addition to the processing blocks shown in FIG. 1, a CRC encoder (not shown for simplicity) would be typically employed. Also, the transmitter 5100 may include various other blocks as known in the art and as discussed in other embodiments.

In the prior art, such as in the S. ten Brink et al. method, check nodes 5103 are bi-regular and composed of degree 1 check nodes (i.e. check by-pass by simply forwarding the incoming message bits to the accumulator 5104) and degree 3 check nodes that perform modulo-2 addition of every three incoming bits from the interleaver 5102 before passing the coded bits to accumulator 5104. According to certain embodiments, several substantive improvements are made. First, differently from the S. ten Brink et al. method, to improve BER performance and lower the error floor, a subset of repeat 2 bit nodes in 5101 is replaced with code words of a linear block code of rate R=½, e.g., using Hamming (8,4) similarly as in Park et al. method.

Figure 2:
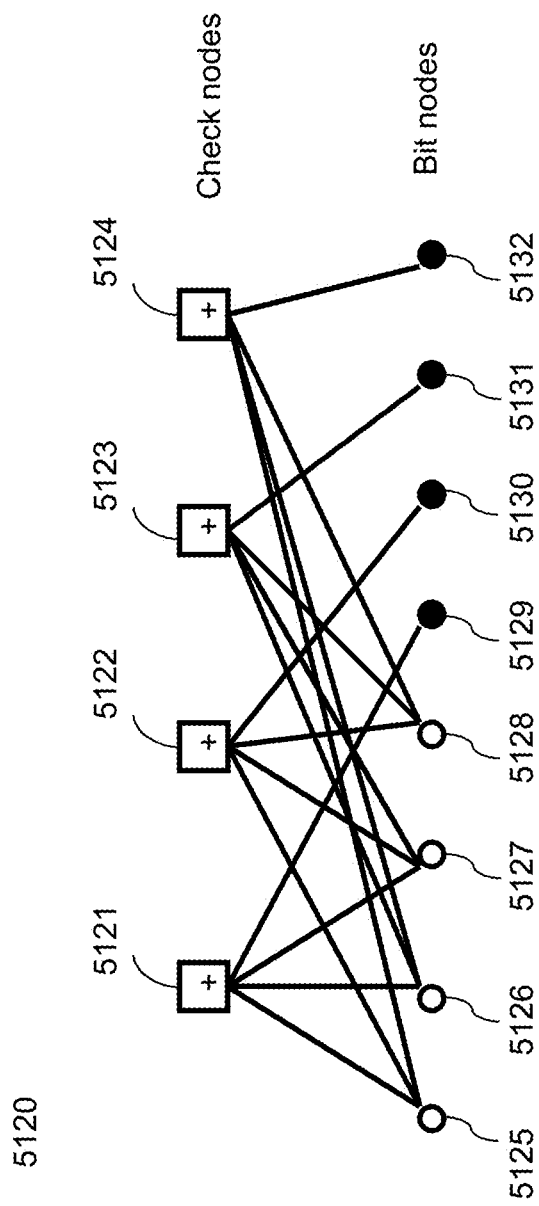
FIG. 2 is a Tanner graph of Hamming (8,4) code.

In one exemplary embodiment, the Hamming (8,4) code words correspond to a linear block code with a parity-check matrix of, as in Park et al. method, $$H = \begin{bmatrix} 1 & 1 & 1 & 0 & 1 & 0 & 0 & 1 \\ 1 & 0 & 1 & 1 & 0 & 1 & 0 & 0 \\ 0 & 1 & 1 & 1 & 0 & 0 & 1 & 0 \\ 1 & 1 & 0 & 1 & 0 & 0 & 0 & 1 \end{bmatrix} \quad (2)$$

and a factor graph 5120 shown in FIG. 2 which may be employed in certain embodiments. In this figure, the empty circles 5125-5128, black circles 5129-5132, and check boxes 5121-5124, respectively, denote information bit nodes, parity bit nodes, and check nodes, respectively. Decoding of Hamming (8,4) code words is performed using belief propagation on a Tanner graph, e.g., using Sum-Product Algorithm (SPA) or Min-Sum Algorithm (MSA) or a block- or trellis-based Maximum A Posteriori (MAP) probability decoder, or any other Soft-Input Soft-Output (SISO) based algorithm as known in the art.

In another embodiment, bit-node repeaters of higher degrees in 5101, such as 24 and 49, may be appended, differently from the S. ten Brink et al. method, to improve BER performance and to lower the error floor. In yet another embodiment, degree 4 check nodes are appended in 5103, differently from the S. ten Brink et al. and Park et al. methods, to make the code more irregular and to outperform check regular and check bi-regular ones of those in Park et al. S. ten Brink et al., respectively. Moreover, the irregular structure of check nodes of multiple different degrees provides additional flexibility, i.e. degrees of freedom, to design a good code of desired coding rate. In yet another embodiment, differently from the S. ten Brink et al. and Park et al. methods, the accumulator 5104 is replaced with a convolutional code of R=1 with a larger memory order. This increases the number of trellis states and decoding complexity but further reduces the error floor.

In yet another embodiment, a precoder, such as an accumulator, or an outer code can be added in 5101 for additional protection of bits to be encoded by repeat 2 nodes, and/or Hamming (8,4) code words and repeat 3 bits nodes, which are more susceptible to errors, and thus to improve the overall code performance. For example the outer code can be a Single-Parity-Check (SPC) code or some other high coding-rate code, such as BCH, Reed-Solomon, Fountain, or Raptor code. In yet another embodiment, all message bits on line 5107 could be encoded by a high-rate code. In yet another embodiment, less significant source bits could be directed to less error resilient positions, for example, to degree 2 repeat nodes and/or Hamming (8,4) code words and repeat 3 bit nodes in 5101, while more significant source bits could be directed to other higher-degree bit-node repeaters in 5101.

Check-Irregular Non-Systematic IRA Decoder and Receiver

Figure 3:
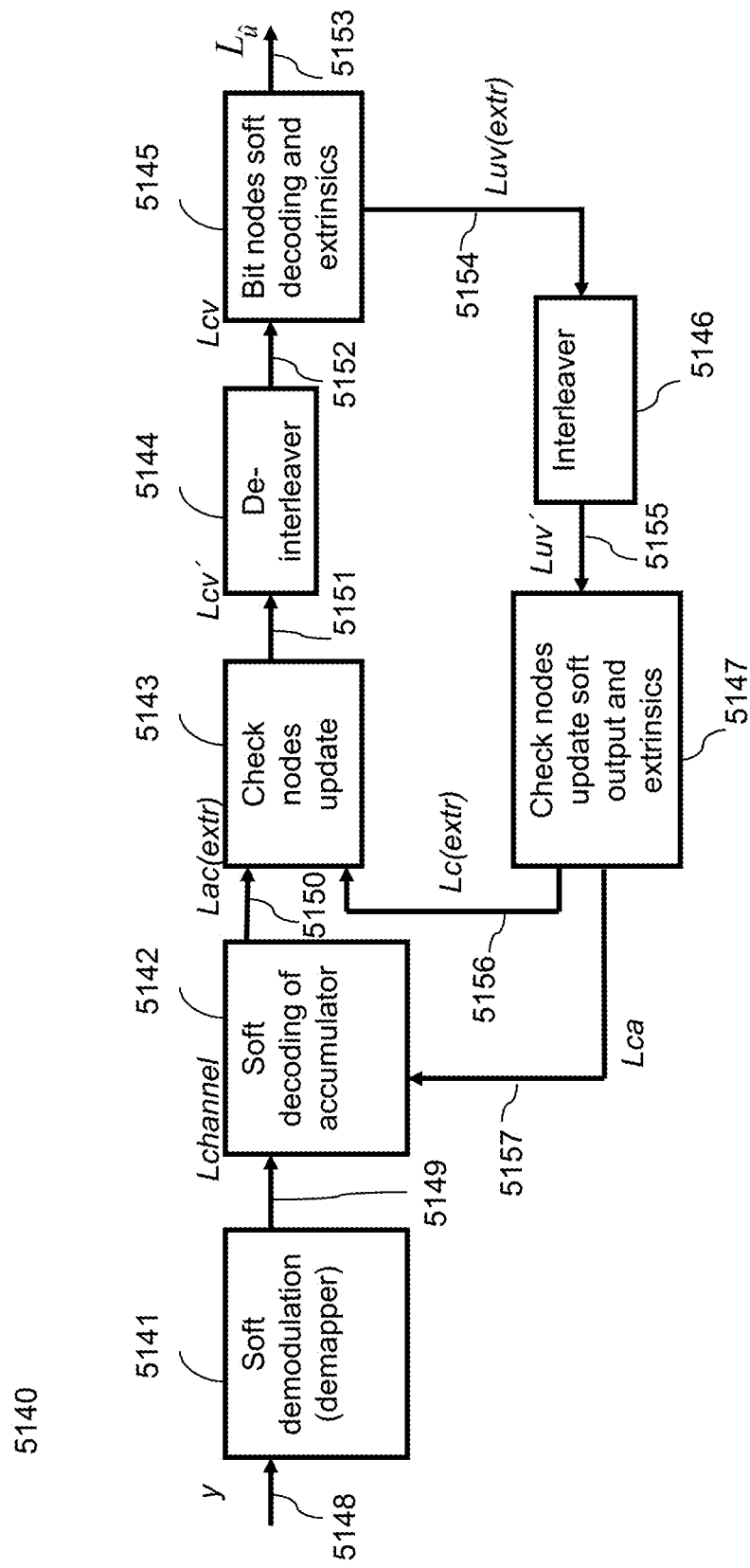
FIG. 3 is a simplified block diagram of a decoder for a check-irregular non-systematic IRA decoder in accordance with certain embodiments of the present invention.

In reference to FIG. 3, and in accordance with certain embodiments, the received noisy symbol sequence $y = \{y_k\}$ on line 5148 is soft-demodulated by demodulation demapper 5141 to produce Log-Likelihood Ratios (LLRs) of coded bits from the received, distorted channel symbols. The decoding operation of check-irregular non-systematic IRA codes 5140 follows the general structure shown in FIG. 3. The decoding is composed of the following steps:

Initialization of a priori information of check node decoders $L_{c(extr)}$ on line 5156 to zero.

Initialization of a priori information of accumulator decoder (e.g., Log-MAP decoder as known in the art) $L_{ca}$ on line 5157 to zero.

Repeat the following: until a predefined maximum number of iterations is reached, or until some other stopping criterion (based on a metric defining the "quality" of output LLRs) is met, or until the correct frame is obtained as detected by the CRC decoder or other error detection decoder.

Soft decoding of accumulator 5142; Accumulator decoding can be performed using belief propagation on a Tanner graph, e.g., using SPA or MSA or with a Log-MAP decoder or Max-Log-MAP decoder on a trellis, or any other SISO-based algorithm as known in the art.

Inputs: Log-likelihood ratios (LLRs) from the demapper, denoted as ($L_{channel}$) on line 5149 and a priori information from the check nodes ($L_{ca}$) on line 5157 obtained in the previous iteration. The channel LLRs ($L_{channel}$) on line 5149, obtained after the demapping operation in block 5141 and corresponding to the LLRs of bits $x_k(i)$, are computed as:

$$L_{channel}[C_k(i)] = \log \frac{P[C_k(i) = 0]}{P[C_k(i) = 1]} \quad (3)$$

$$= \log \frac{\sum_{x_k \in X_0^i} p_k(y_k | x_k) \prod_{j=1, j \neq i}^{m} \exp\{-L_a(C_k(j)) \cdot x_k(j)\}}{\sum_{x_k \in X_1^i} p_k(y_k | x_k) \prod_{j=1, j \neq i}^{m} \exp\{-L_a(C_k(j)) \cdot x_k(j)\}}$$

where $C_k(i)$ is a binary random variable with realizations $x_k(i) \in \{0,1\}$ and $y_k$ represents the received noisy symbol sequence. The sum in the numerator is taken over all symbols $x_k$ for which the i-th bit is equal to 0, and the sum in the denominator is taken over all symbols $x_k$ for which the i-th bit is equal to 1. The first variable $p_k(y_k|x_k)$ in both the numerator and the denominator represents the conditional probability density function of the received symbols, given transmitted symbol $x_k$. The variable $L_a(C_k(i))$ denotes the a priori LLRs of bit $x_k(j)$ where $x_k(j)$ is the j-th bit associated with symbol $x_k$. It is assumed, without loss of generality, that $\{L_a(C_k(i))\}$ are 0 in the initial iteration and in the subsequent iterations they correspond to the extrinsic information from the check-irregular non-systematic IRA decoder. The conditional probability density function of received symbols, given transmitted symbol $x_k$, is defined as:

$$p(y_k | x_k) = \frac{1}{\sqrt{2\pi\sigma^2}} \exp\left(-\frac{|y_k - A_k x_k|^2}{2\sigma^2}\right) \quad (4)$$

where $A_k$ denotes the amplitude of instantaneous fading channel coefficient mentioned earlier.

For BPSK modulation, the expression in (3) simplifies to $$L_{channel}(k) = L_c(k)y_k = \frac{2}{\sigma^2} A_k y_k \quad (5)$$

The a priori information from the check nodes ($L_{ca}$) obtained in the previous iteration on line 5157 is computed by (18)-(19).

Output: Extrinsic information on line 5150 can be calculated as (e.g., using a Log-MAP algorithm):

$$L_{ac(extr)} = \quad (6)$$
$$\max_{u_k = 1} * (\{\gamma_k^{extr}(s', s) + \alpha_{k-1}(s) + \beta_k(s')\}, \{\gamma_k^{extr}(s', s) + \alpha_k(s) + \beta_k(s')\}) -$$
$$\max_{u_k = -1} *$$
$$(\{\gamma_k^{extr}(s', s) + \alpha_{k-1}(s) + \beta_k(s')\}, \{\gamma_k^{extr}(s', s) + \alpha_k(s) + \beta_k(s')\})$$

where
$$\max^*(x,y) = \max(x,y) + \ln\{1 + \exp(-|x-y|)\} \quad (7)$$

In (6), $\alpha$ and $\beta$ are the forward recursion and backward recursion of the Log-MAP algorithm, respectively, assuming that a transition occurs from a trellis state s' at time instant k-1 to a trellis state s at time instant k with the branch transition probability $\gamma$. These values are computed as known in the art:

$$\alpha_k(s) = \log \sum_{s'} \exp\{\alpha_{k-1}(s) + \gamma_k(s', s)\} = \max_{s'} * \{\alpha_{k-1}(s) + \gamma_k(s', s)\} \quad (8)$$

$$\beta_{k-1}(s') = \log \sum_{s} \exp\{\beta_k(s') + \gamma_k(s', s)\} = \max_{s} * \{\beta_k(s') + \gamma_k(s', s)\} \quad (9)$$

where $$\gamma_k(s', s) = \frac{1}{2} L_c(k) y_k x_k + \frac{1}{2} u_k L(u_k) \quad (10)$$

In (10), $L_c(k)$ is defined as in (5), i.e., $$L_c(k) = \frac{2}{\sigma^2} A_k,$$

$y_k$ and $x_k$ correspond to the received and transmitted coded bits, respectively. $u_k$ represents the information bit and $L(u_k)$ represents the a priori knowledge of the information bit at the decoder, i.e. equal to $L_{ca}$ on line 5157. Also, the so-called extrinsic term of $y_k^{extr}$ used in (6) is computed as follows:

$$\gamma_k^{extr}(s', s) = \frac{1}{2} L_c(k) y_k x_k \quad (11)$$

Check nodes update in block 5143

Inputs: The extrinsic information from the soft accumulator decoder ($L_{ac(extr)}$) on line 5150 and a priori information from the bit nodes obtained in the previous iteration ($L_{a\,priori} = L_{c(extr)}$ on line 5156), which is computed in (20) below.

Soft Output on Line 5151

For degree 1 check nodes (i.e., check by-pass)

The check nodes update in block 5143 simply forwards the incoming messages to the de-interleaver 5144, i.e., $$L_{cv'} = L_{ac(extr)} \quad (12)$$

Check nodes with degree greater than one, the output is calculated by $$L_{cv'} = L_{ac(extr)} \boxplus L_{a\,priori} \quad (13)$$

where $\boxplus$ denotes the box-plus operation implemented with 2 max* operations, i.e., $$x \boxplus y = \max^*(0, x+y) - \max^*(x, y) \quad (14)$$

This corresponds to the optimal SPA as known in the art. For more than two arguments, the box-plus operation is applied recursively as, e.g.:

$$x \oplus y \oplus z = [x \oplus (y \oplus z)] \quad (15)$$

Repetition bit decoder in block 5145
Input: De-interleaved output on line 5152 from the check nodes ($L_{cv}$)
Soft Output on Line 5153

$$L_{\hat{u}}(j) = \sum_{k \in N_{uj}} L_{cv}(k, j) \quad (16)$$

where $L_{cv}(k, j)$ is the incoming messages (LLRs) from the check node k to bit node j and $N_{uj}$ is the set of all check nodes that bit node j is connected to.

Hard decisions are taken from $L_{\hat{u}}(j)$ on line 5153, if the maximum number of iterations is reached, or if another stopping criterion is satisfied.
Extrinsic Information on line 5154

$$L_{uv(extr)}(i, j) = \sum_{k \in N_{uj\setminus i}} L_{cv}(k, j) \quad (17)$$

where $N_{uj\setminus i}$ is the set of all check nodes that bit node j is connected to except for check node i. $L_{cv}(k, j)$ represents extrinsic information from check node k to bit node j.

Then, the extrinsic information $L_{uv(extr)}$ is interleaved in block 5146 and its output $L_{uv'}$ on line 5155 is supplied to block 5147 that produces $L_{c(extr)}$ on line 5156 used as the a priori information for check nodes update computation in (13).

Check nodes to accumulator decoder update in block 5147
Input: A priori information from bit nodes ($L_{uv'}$) on line 5155.
Soft Output
Degree 1 check nodes (i.e., check by-pass)
Incoming messages are simply forwarded to the accumulator in block 5142

$$L_{ca} = L_{uv'} \quad (18)$$

Check nodes with degree greater than one on line 5157

$$L_{ca}(i) = \sum_{k \in N_{ci}} \oplus L_{uv'}(i, k) \quad (19)$$

where the summation is in box-plus operation and $N_{ci}$ is the set of bit nodes participating in check equation i.

This soft output information ($L_{ca}$ on line 5157) is used as a priori information in the Log-MAP decoder in the next iteration.
Extrinsic Information on Line 5156
Check nodes with degree greater than one $$L_{c(extr)}(i, j) = \sum_{k \in N_{ci\setminus j}} \oplus L_{uv'}(i, k) \quad (20)$$

where the summation is in box-plus operation and $N_{ci\setminus j}$ is the set of all bit nodes participating in check equation i except for bit node j.

This is the extrinsic information for each check node with degree greater than one that is used as a priori information ($L_{a\ priori}$) in the next iteration.

Figure 4:
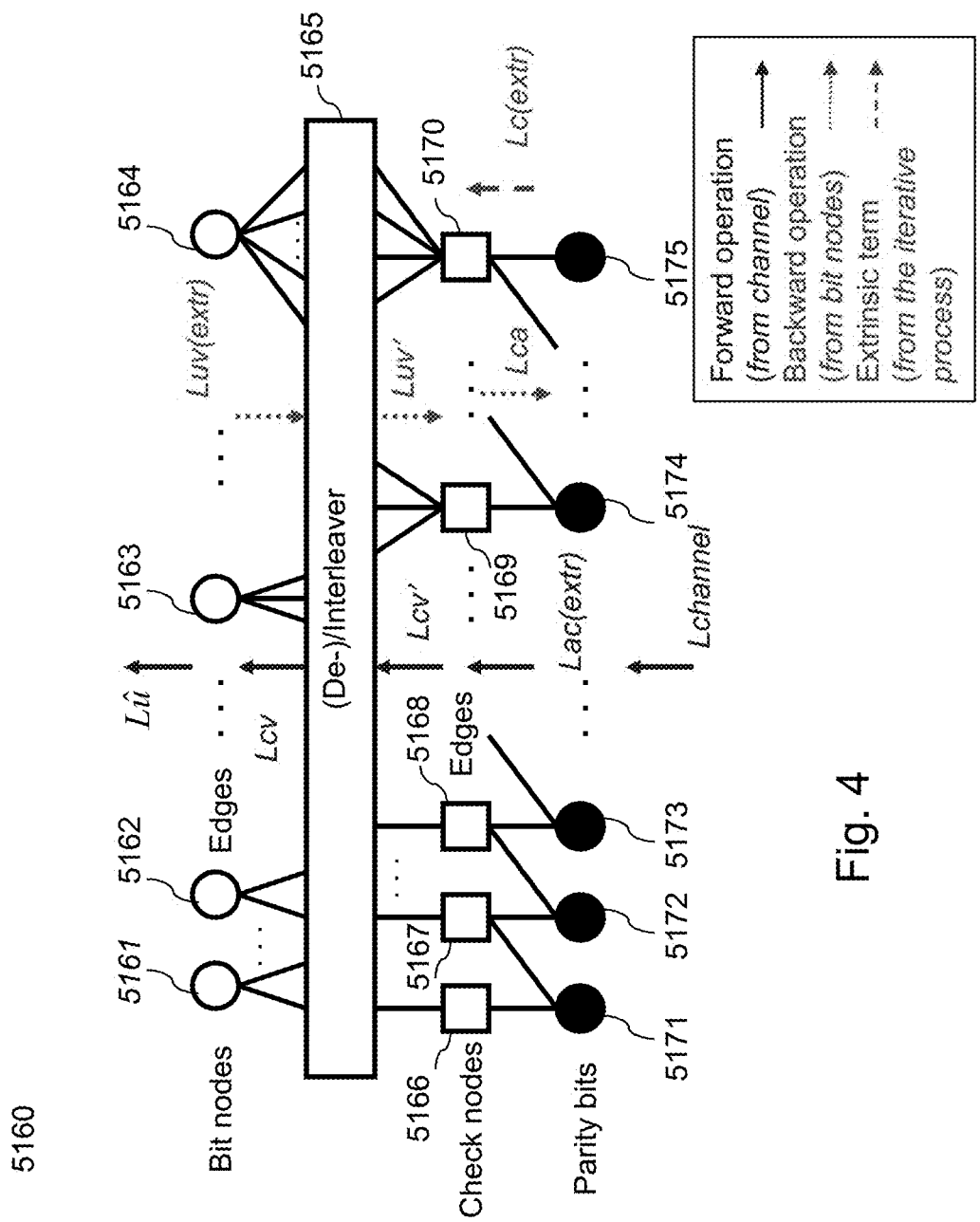
FIG. 4 is a Tanner graph of check-irregular non-systematic IRA code and decoder message passing flow in accordance with certain embodiments of the present invention.

The Tanner graph of the check-irregular non-systematic IRA code and the decoder message passing flow 5160 are depicted in FIG. 4 in accordance with certain embodiments, for the case when all bit nodes 5161-5164 are simple repeaters. In some embodiments, a subset of repeater bit nodes could be replaced by Tanner graphs of some linear block codes. For example, a subset of degree 2 bit nodes 5161-5162 can be replaced by Tanner graphs of Hamming (8,4) codes. The interleaver/deinterleaver block 5165 performs pseudo-random interleaving in the direction from bit nodes to check nodes and corresponding deinterleaving in the opposite direction. Check nodes 5166-5168 are simply check node by-passes. Check nodes of degree greater than 1, namely 5169 and 5170, are check node combiners which perform modulo-2 addition of bits on multiple edges coming from the interleaver 5165. Parity bits 5171-5175 are the result of differential encoding by the accumulator encoder.

Degree Nodes Distribution and Performance Results-Check-Irregular Non-Systematic IRA Codes One exemplary embodiment includes certain designs pertaining to low coding rate check-irregular non-systematic IRA codes (R=1/3 and 5/12). These codes could be used as channel codes with improved performance in applications where such check-irregular non-systematic IRA codes may be desirable, as discussed earlier. The distributions of parameters for bit nodes 5161-5164 and check nodes 5166-5170 are depicted in Table 1 for two different coding rates, i.e. R=1/3 and 2/5, and 30000 bits per frame, which is typical for broadcasting applications. The distribution parameters may change appropriately for other coding rates and frame sizes.

TABLE 1

Check-irregular non-systematic IRA codes distributions for two cases of coding rate R

| R = 1/3 | | R = 5/12 | |
| --- | --- | --- | --- |
| Bit nodes degree | Check nodes degree | Bit nodes degree | Check nodes degree |
| 6.1% Hamming (8, 4) | 22.2% degree 1 | 12.2% Hamming (8, 4) | 15.255% degree 1 |
| 23.3% degree 3 | 63.4% degree 3 | 29% degree 3 | 84.234% degree 3 |
| 39.1% degree 4 | 14.4% degree 4 | 37.2% degree 4 | 0.511% degree 4 |
| 19.5% degree 13 | | 14.6% degree 13 | |
| 10.8% degree 24 | | 5.8% degree 24 | |
| 1.2% degree 49 | | 1.2% degree 49 | |

Figure 5A:
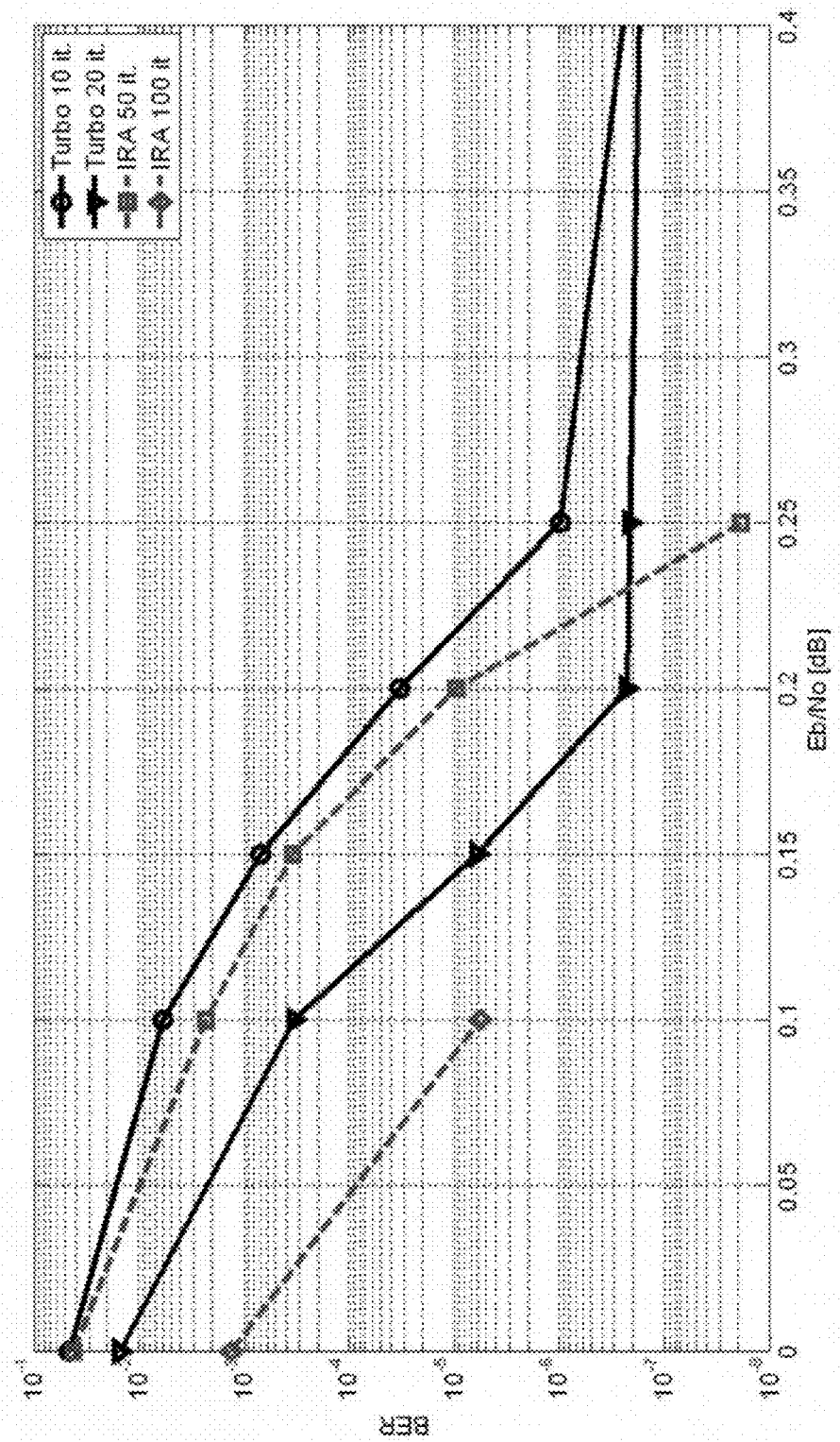
FIGS. 5A and 5B depict performance comparison of check-irregular non-systematic IRA codes used in certain embodiments of the present invention and turbo codes with coding rate R=⅓ assuming BPSK modulation, where
Figure 5B:
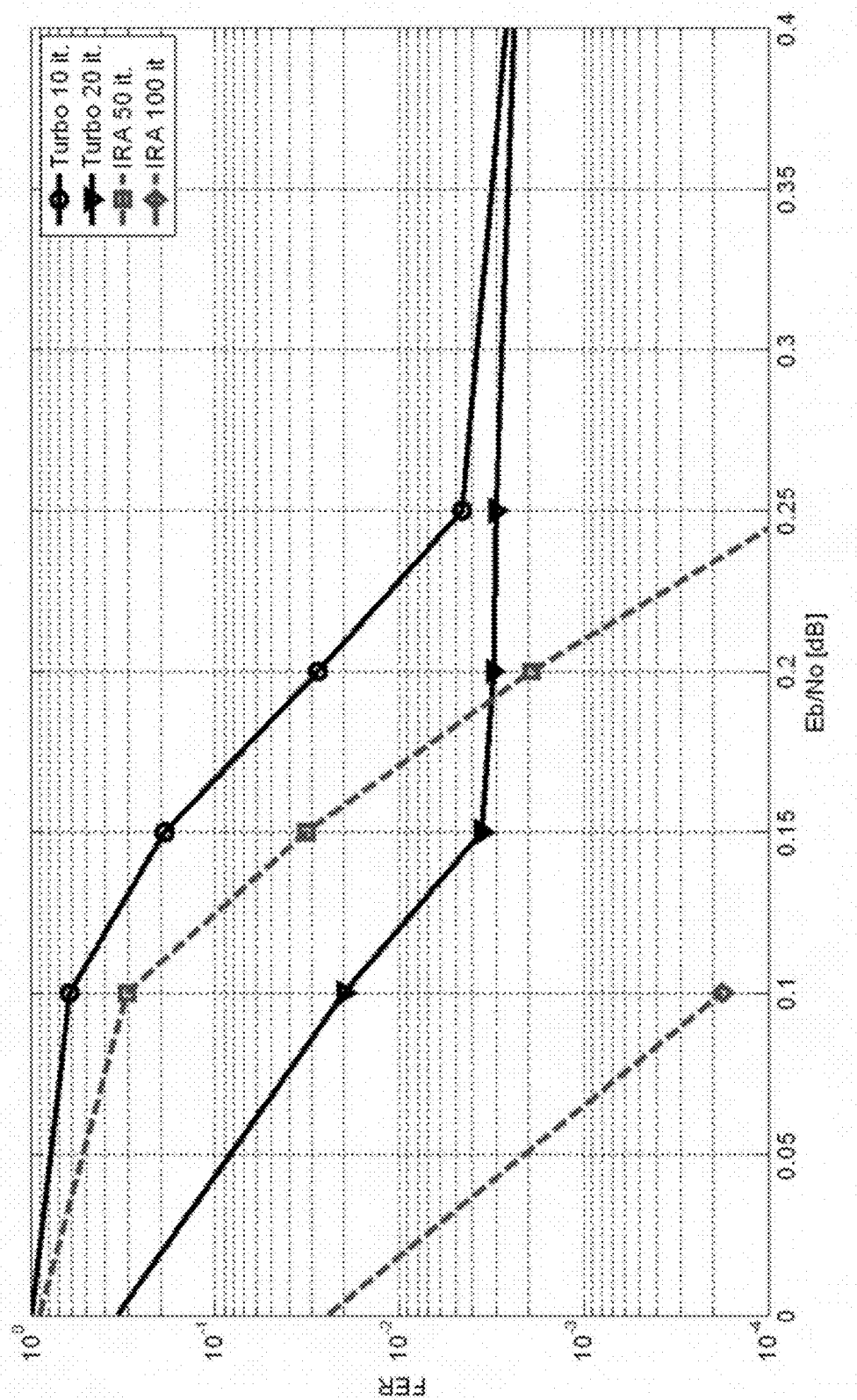
Figure 6A:
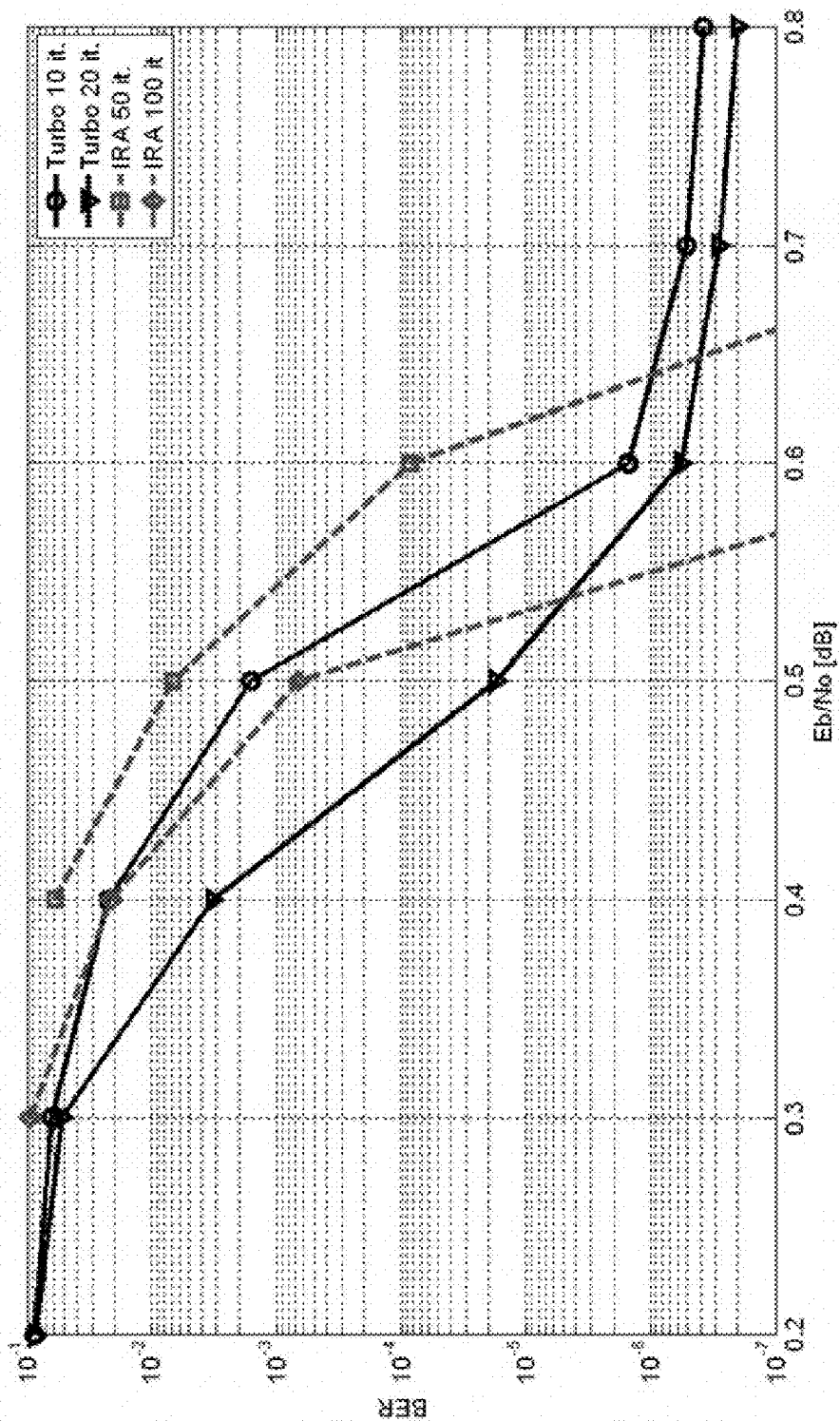
FIGS. 6A and 6B depict performance comparison of check-irregular non-systematic IRA codes used in certain embodiments of the present invention and turbo codes with coding rate R=5/12 assuming BPSK modulation, where
Figure 6B:
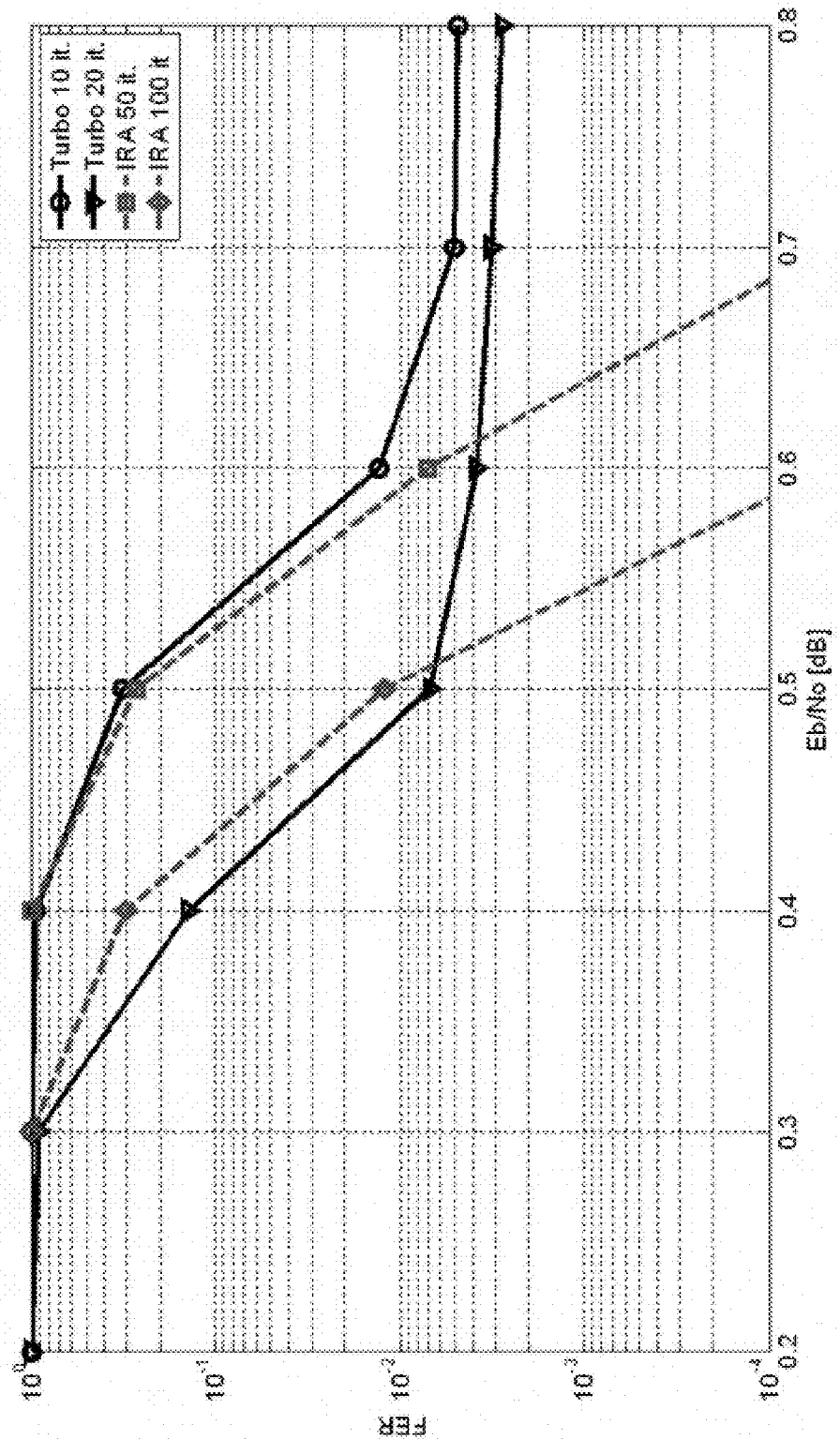
Figure 7:
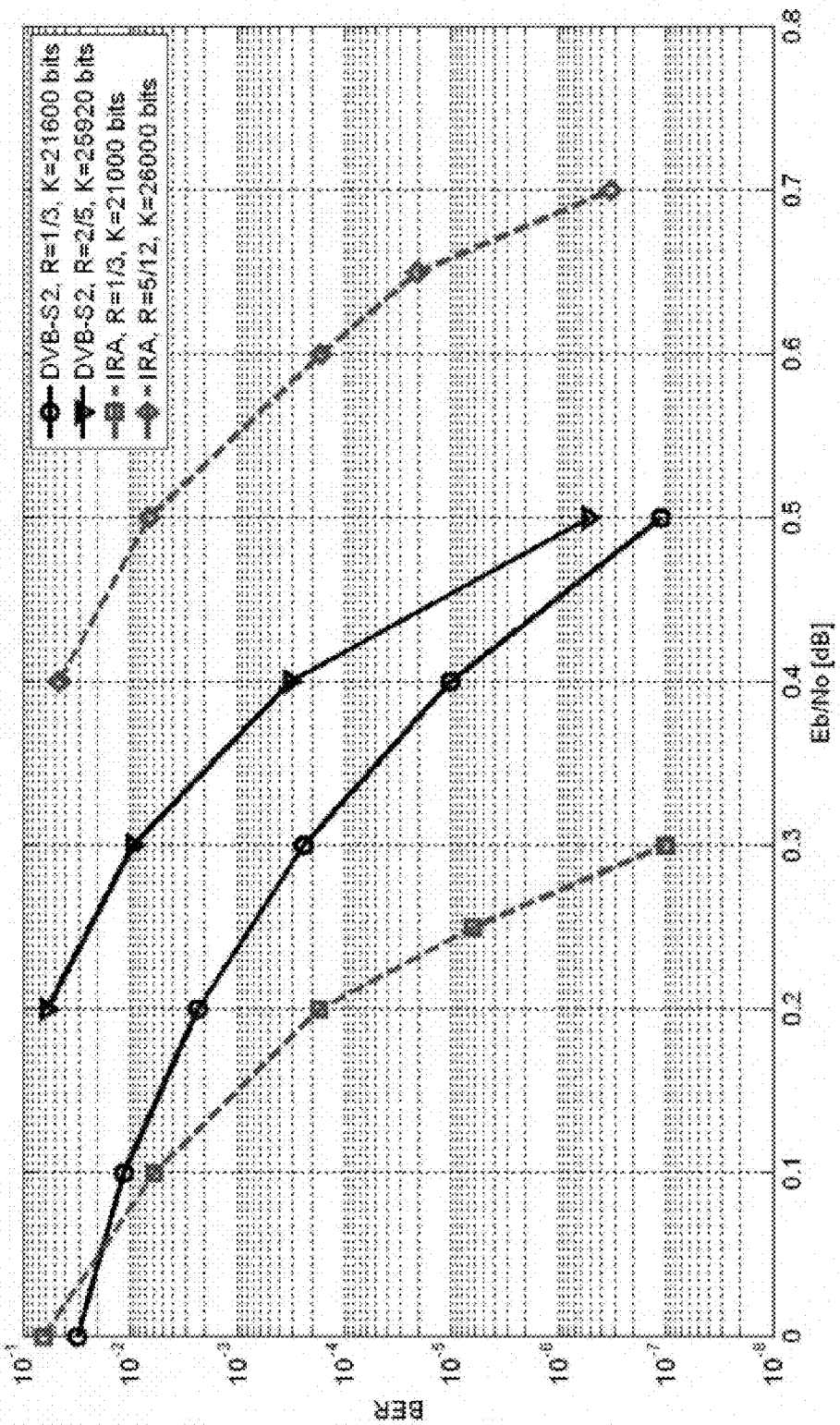
FIG. 7 depicts performance comparison of check-irregular non-systematic IRA codes used in certain embodiments of the present invention and systematic IRA codes from the DVB-S2 standard with comparable frame sizes assuming BPSK modulation.

In accordance with certain embodiments, performance evaluation results are depicted in FIG. 5 and FIG. 6 for R=1/3 and 5/12, respectively, assuming BPSK modulation and transmission over an AWGN channel. Decoding of accumulator and Hamming (8,4) codes is performed using Log-MAP and block MAP decoders, respectively, and decoding of other IRA nodes is performed using the SPA algorithm. FIG. 5 depicts also the performance of R=1/3 turbo code with the same information size, having 8-states and employing the optimal Log-MAP decoding algorithm. It is shown that the check-irregular non-systematic IRA code outperforms the turbo code for two sets of iterations, i.e. 50 and 10, or 100 and 20, for IRA and turbo codes, respectively. At FER=10-3, the check-irregular non-systematic IRA code with 30000 information bit block size is about 0.6 dB away from Shannon capacity. It was verified by simulations that the gap becomes smaller for larger block sizes. The turbo code exhibits an error floor at FER=10-3 (BER=10-7), whereas the check-irregular non-systematic IRA code does not. FIG. 6 depicts also the performance of R=5/12 turbo code obtained by puncturing the parity bits of the corresponding R=1/3 turbo code. In this case, the check-irregular non-systematic IRA code performance is slightly degraded against turbo code for the same sets of iterations at BER>10-5 (FER>10-2). However, it has a better slope and lower error floor outperforming the turbo code at lower BER/FER values. FIG. 7 shows a performance comparison of check-irregular non-systematic IRA codes with coding rates R=1/3 and 5/12 in accordance with certain embodiments. The block sizes were adapted to match those of the corresponding systematic IRA codes used in DVB-S2 standard. BPSK modulation is assumed. As shown with dashed lines, check-irregular non-systematic IRA code with block size K=21000 bits and R=1/3 outperforms DVB-S2 code by about 0.2 dB. The DVB-S2 code has block size K=21600 bits. The check-irregular non-systematic IRA code with block size K=26000 bits and R=5/12 performs worse by about 0.2 dB compared to DVB-S2 code with block size K=25920 bits and R=2/5.

Check-Irregular Non-Systematic IRA Codes with Complementary Puncturing

Figure 8:
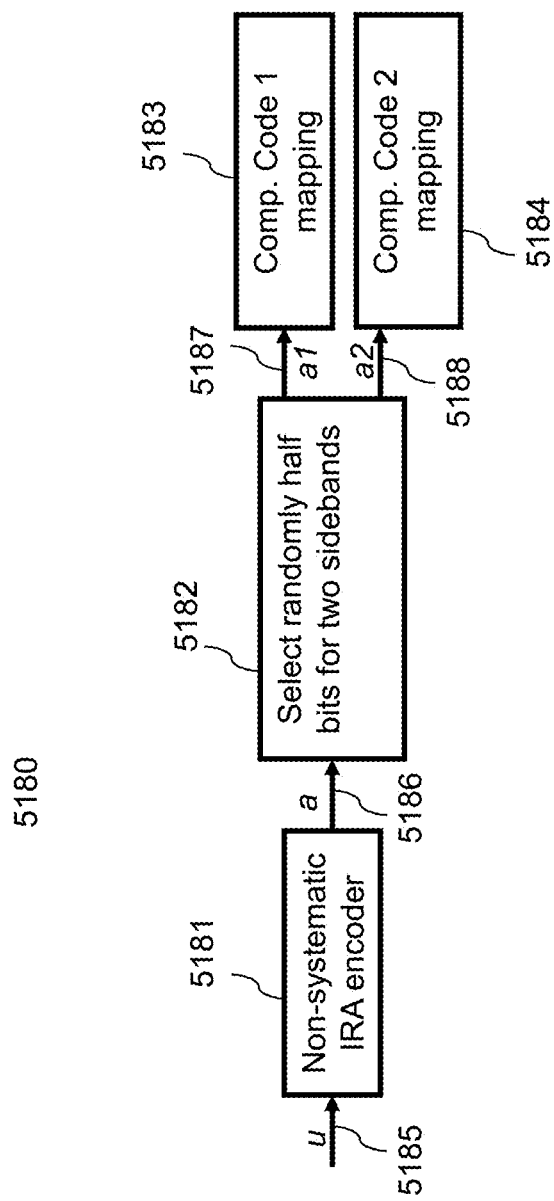
FIG. 8 is a block diagram depicting the use of check-irregular non-systematic IRA codes with complementary punctured codes in accordance with certain embodiments of the present invention.

In other embodiments, check-irregular non-systematic IRA codes are punctured in a complementary way such to obtain two codes of rate 2·R that when combined in the receiver yield the full rate R code. A simplified block diagram of complementary puncturing scheme 5180 is shown in FIG. 8 in accordance with certain embodiments. The non-systematic IRA encoder block 5181 corresponds to blocks 5101-5104 of FIG. 1, in which information bits are as input on line 5185. The coded bits from the accumulator output on line 5111 in FIG. 1 and before modulation mapping 5105, correspond to the bits on line 5186 in FIG. 8 at the input of demultiplexer 5182. Half bits are chosen randomly in block 5182 in FIG. 8 for complementary code 1 transmission ($a_1$) on line 5187 and the other half bits ($a_2$) on line 5188 are for complementary code 2 transmission. With this, two codes of rate 2·R are formed in blocks 5183 and 5184, respectively. As long as one code is received, the decoder could decode the overall message, and a partial loss of coded bits, i.e., a fraction of coded bits is lost or degraded, results in a graceful degradation relative to the performance of the full rate code. Since the coded bits have been split in demultiplexer 5182 pseudo-randomly, the same performance is expected for each individual rate 2·R code at the receiver.

Figure 9:
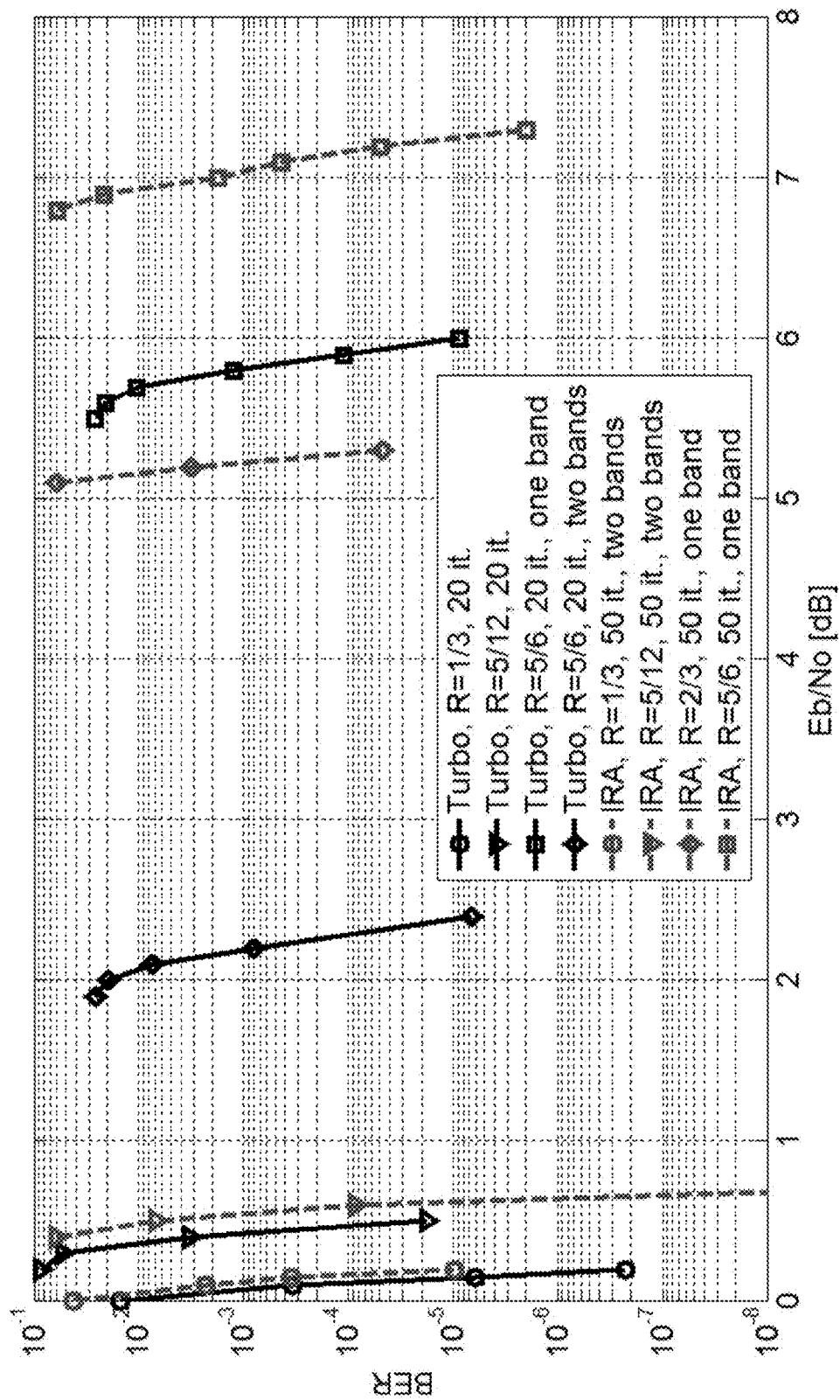
FIG. 9 depicts performance comparison of check-irregular non-systematic IRA codes used in certain embodiments of the present invention and turbo codes with full coding rates R=⅓ and 5/12 with either both or one sideband (complementary code) received, assuming BPSK modulation.

Performances of the complementary punctured codes are shown in FIG. 9 for check-irregular non-systematic IRA codes with code rates R=1/3 and 5/12, respectively, in accordance with certain embodiments, assuming BPSK modulation when: (i) both complementary codes (two bands) are received; and (ii) one complementary code (one band) is completely lost due to channel impairments. All simulation parameters are as in FIG. 5 and FIG. 6, respectively. The number of decoding iterations is set to 50 for check-irregular non-systematic IRA codes and 20 for turbo codes, respectively. It can be seen that check-irregular non-systematic IRA codes have better performance than turbo codes when both complementary codes are received. In the case of turbo codes, significant performance degradation is observed. For instance, the combined two rate 5/6 turbo codes show a performance loss of 2 dB with respect to the full rate 5/12 turbo code. This is due to the fact that, for systematic codes, the systematic bits have to be repeated in each sub-code; otherwise, the performance of the sub-code would be very bad. On the other hand, a single, optimized R=5/6 turbo code outperforms the single complementary punctured check-irregular non-systematic IRA R=5/6 code by 1.25 dB. However, rarely would one complementary code be completely lost, and in most scenarios, both complementary codes would be received or one or both complementary codes would be partially degraded. In such scenarios, the check-irregular non-systematic IRA code of certain embodiments is expected to exhibit better performance than the turbo code or a systematic LDPC code. These complementary codes, as discussed earlier, could be applicable in many systems, such as HD Radio, Sirius/XM Satellite Digital Radio, and other similar scenarios where a fraction of bits could be lost due to channel impairments.

Figure 10A:
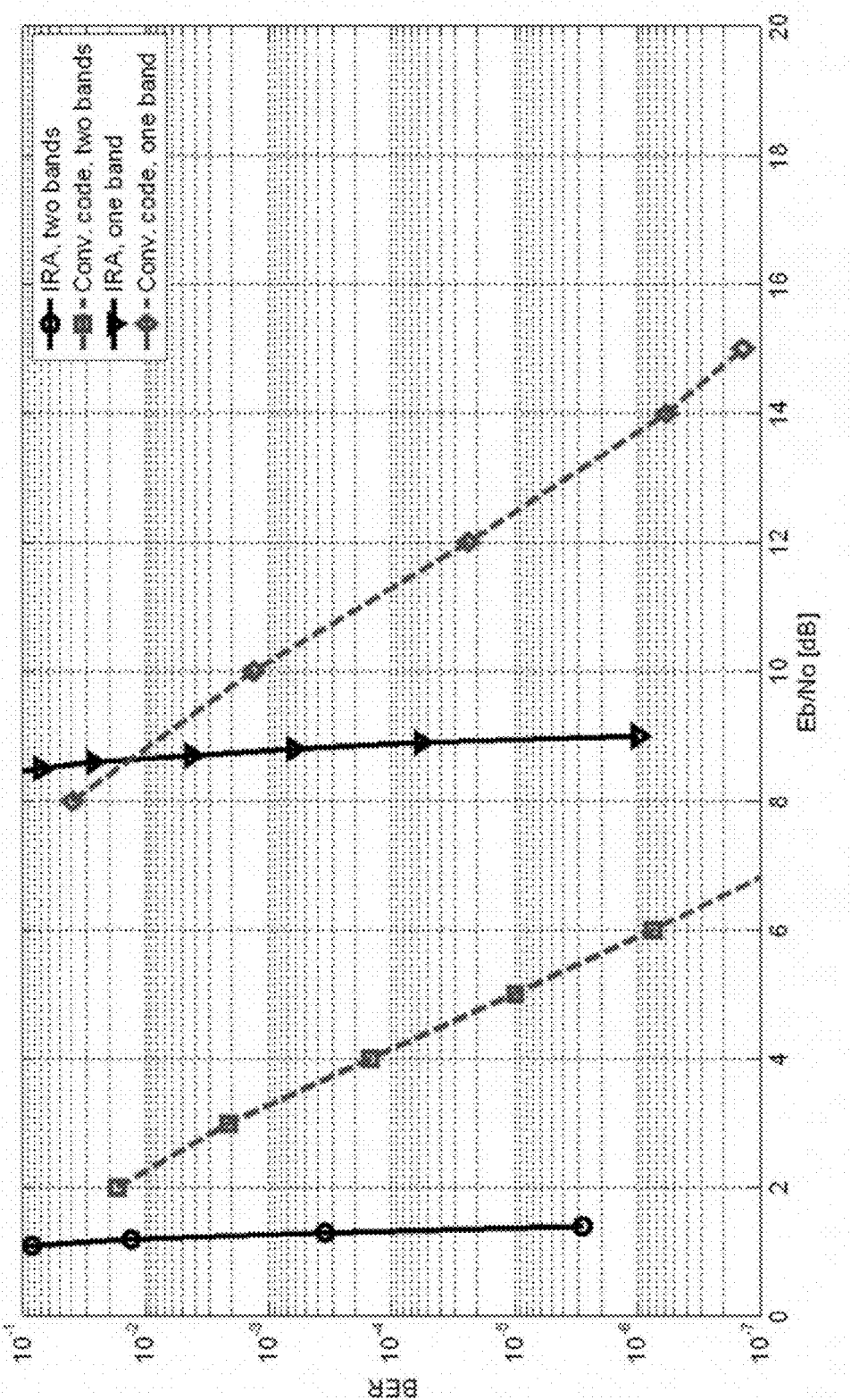
FIGS. 10A and 10B depict performance comparison of check-irregular non-systematic IRA codes used in certain embodiments of the present invention and convolutional codes with either both or one sideband received; independent Rayleigh fading channel, BPSK modulation, coding rate R=⅓, where
Figure 10B:
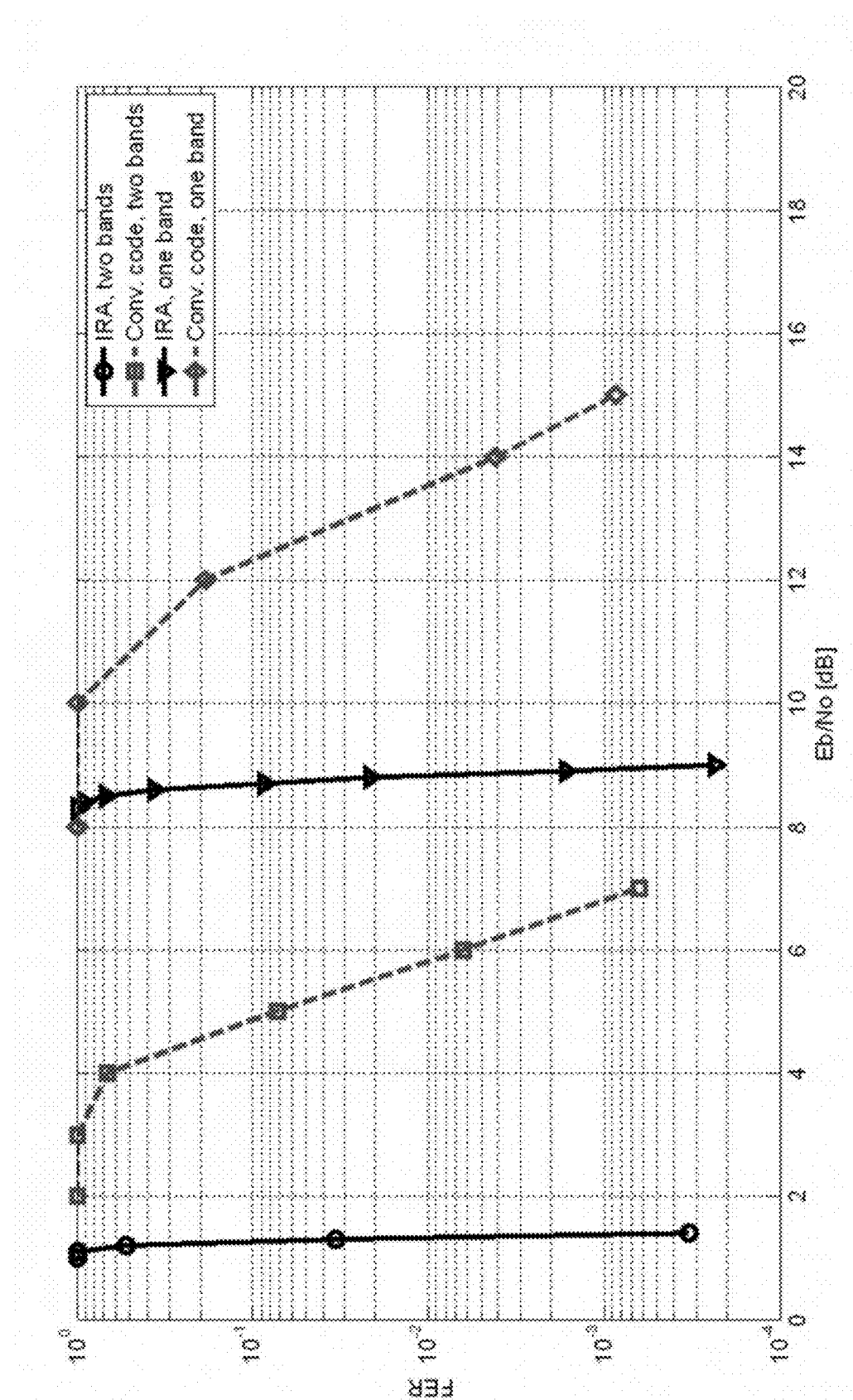
Figure 11A:
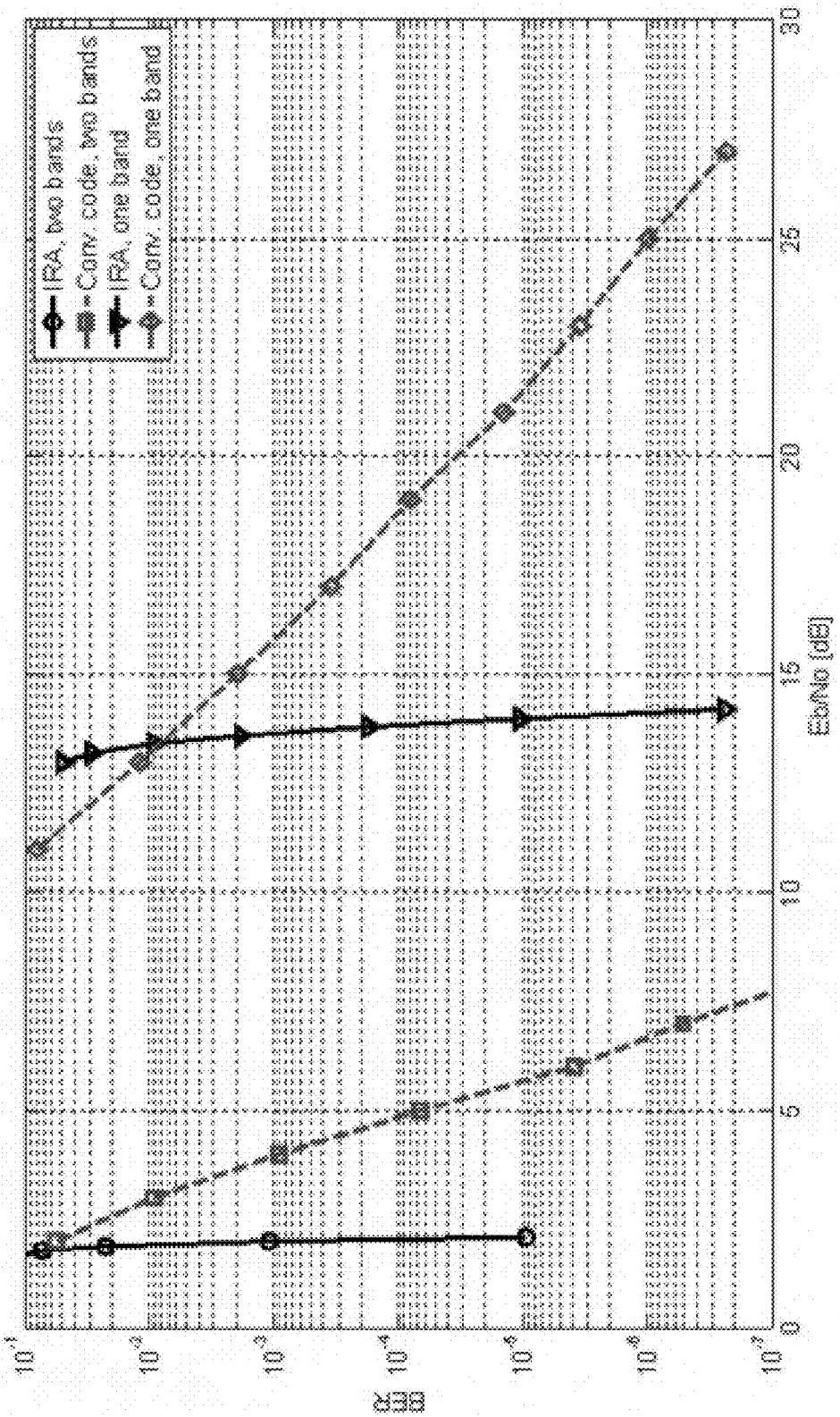
FIGS. 11A and 11B depict performance comparison of check-irregular non-systematic IRA codes used in certain embodiments of the present invention and convolutional codes with either both or one sideband received; independent Rayleigh fading channel, BPSK modulation, coding rate R=5/12, where
Figure 11B:
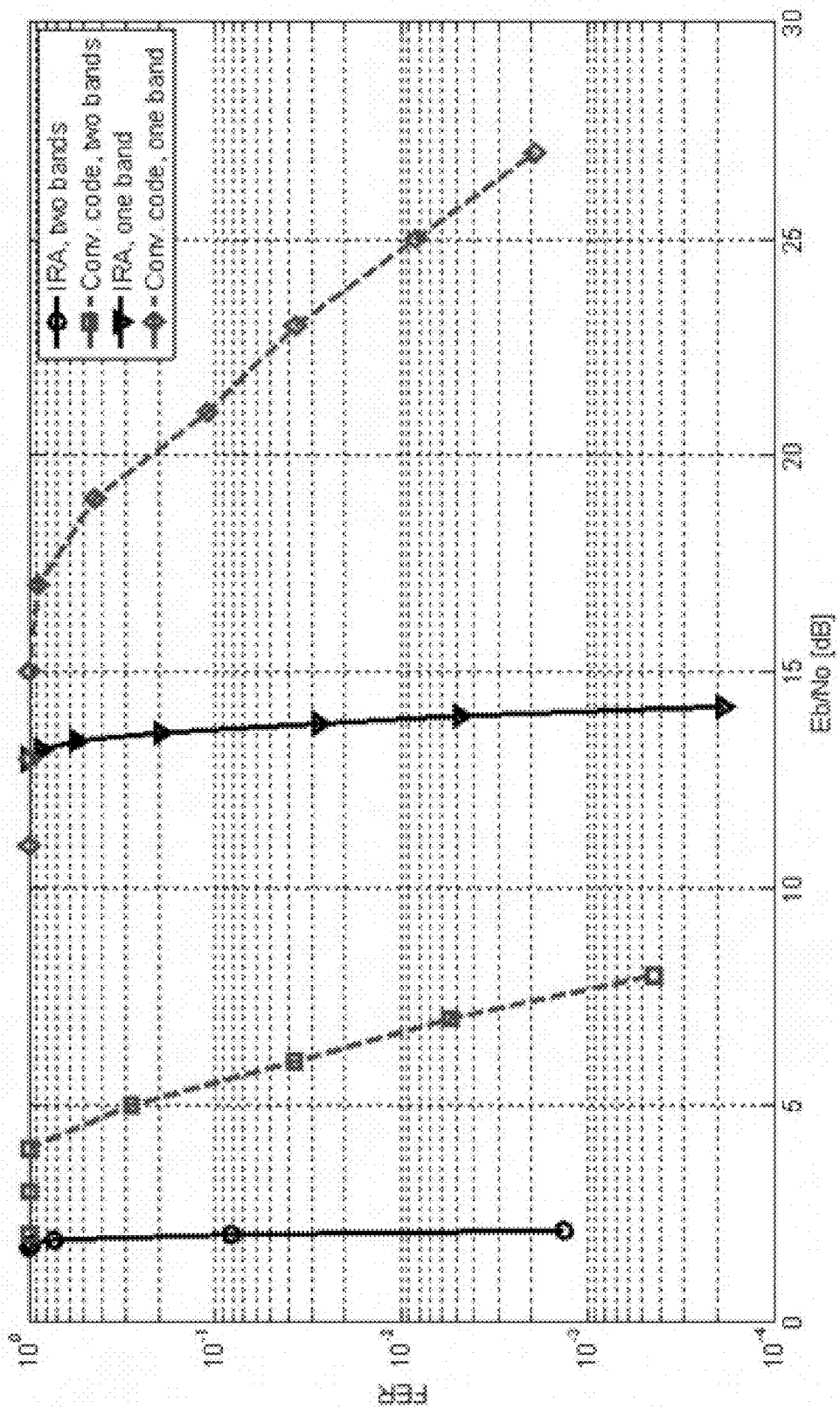

Performance comparison of the complementary punctured check-irregular non-systematic IRA codes in accordance with certain embodiments and non-systematic convolutional codes is depicted in FIG. 10 and FIG. 11 with code rates R=1/3 and R=5/12, respectively, assuming BPSK modulation, independent Rayleigh fading with known fading amplitudes and noise power at the receiver and when: (i) both complementary codes (two bands) are received; and (ii) one complementary code (one band) is completely lost due to channel impairments. A non-systematic convolutional code of constraint length 9 is used with generator polynomials being g1=561, g2=753 and g3=711. The puncturing patterns to obtain rates R=2/3 codes are given in US Patent Publication 2010/7680201 as $$\begin{bmatrix} 1 & 2 & 1 & 2 \\ 1 & 2 & 1 & 2 \\ 2 & 1 & 2 & 1 \end{bmatrix},$$

where 1 and 2, respectively, represent coded bit positions allocated to complementary codes 1 and 2, respectively, used for the two sidebands. The puncturing patterns to obtain R=5/12 code and rates R=5/6 codes are given in US Patent Publication 2003/0212946 as $$\begin{bmatrix} 1 & 2 & 1 & 1 & 2 \\ 1 & 1 & 2 & 2 & 1 \\ 2 & 0 & 2 & 0 & 0 \end{bmatrix},$$

where 0 signifies that the corresponding coded bit position is punctured from the output of the mother code of rate R=1/3, to obtain rate R=5/12, while 1 and 2, respectively, represent coded bit positions allocated to complementary codes 1 and 2, respectively, used for the two sidebands. The performance gain of the check-irregular non-systematic IRA code against non-systematic convolutional code for R=1/3 is about 6 dB when either both side-bands or only one side-band are received, at FER of about 0.001 and the gains are larger at lower values of FER. The performance gain of the check-irregular non-systematic IRA code against non-systematic convolutional code for R=5/12 is about 6 dB when both side-bands are received and about 13 dB when only one side-band is received, at FER of about 0.001 and the gains are larger at lower values of FER.

In another embodiment, the complementary punctured check-irregular non-systematic IRA codes of certain embodiments are applied to FM HD Radio system. BPSK modulation of the previous embodiment is replaced with QPSK modulation, with the same results as in AWGN, or fading channels with perfect phase recovery. Multiple, but not necessarily all logical channels could be aggregated to be encoded by the check-irregular non-systematic IRA code. In certain embodiments, all logical channel of FM HD Radio system could be collectively encoded by the check-irregular non-systematic IRA codes. This simplifies encoding/decoding in that only single FEC code is used instead of multiple FEC codes in the present all-digital FM HDR standard. Another advantage is that aggregating bits from all logical channels into a single check-irregular non-systematic IRA code results in the best overall performance, as the IRA code performance improves with larger block sizes. In certain embodiments, most important bits, such as header information, e.g., could be advantageously placed on most reliable bits of the IRA codes, such as high degree bit nodes in 5101 of FIG. 1, while the least important bits, such as spectral data of audio encoder could be placed on the least reliable bits of the check-irregular non-systematic IRA code.

An FEC code can be adopted efficiently such that complementary codes 1 and 2 in FIG. 8 5183-5184, respectively, correspond to lower and upper sidebands of OFDM subcarriers in FM HDR systems. That is, the two side-bands codes have no common bits to each other and, when combined, yield the full rate code. If both sidebands are received, after transmission over the channel, then the full rate R code is reconstructed at the receiver for best coded performance. Otherwise, if one sideband is lost after channel transmission, then the rate 2·R code is reconstructed at the receiver, whose performance is obviously degraded with respect to the full rate R code because of the loss of half of coded bits. In another embodiment, a bit interleaver is inserted before or after mapping blocks 5183-5184 in FIG. 8, for improved performance.

In another embodiment, the system in FIG. 8 could be adopted to provide both time and frequency diversity by using complementary check-irregular non-systematic IRA codes. At time t1, complementary codes 1 and 2 5183-5184 in FIG. 8 could be transmitted on lower and upper sidebands, respectively. At time t2, sufficiently apart from t1 to provide time diversity, transmission of codes on side-bands is flipped such that codes 1 and 2 5183-5184 in FIG. 8 are transmitted on upper and lower sidebands, respectively. Thus, even if one side-band is completely lost, the full combined code could still be received over time. In another embodiment, four complementary codes, 1, 2, 3 and 4, could be designed and codes 1 and 2 are transmitted at time t1 on lower and upper side-bands, respectively, while codes 3 and 4 are transmitted at time t2 on lower and upper side-bands, respectively, or vice versa.

Figure 12:
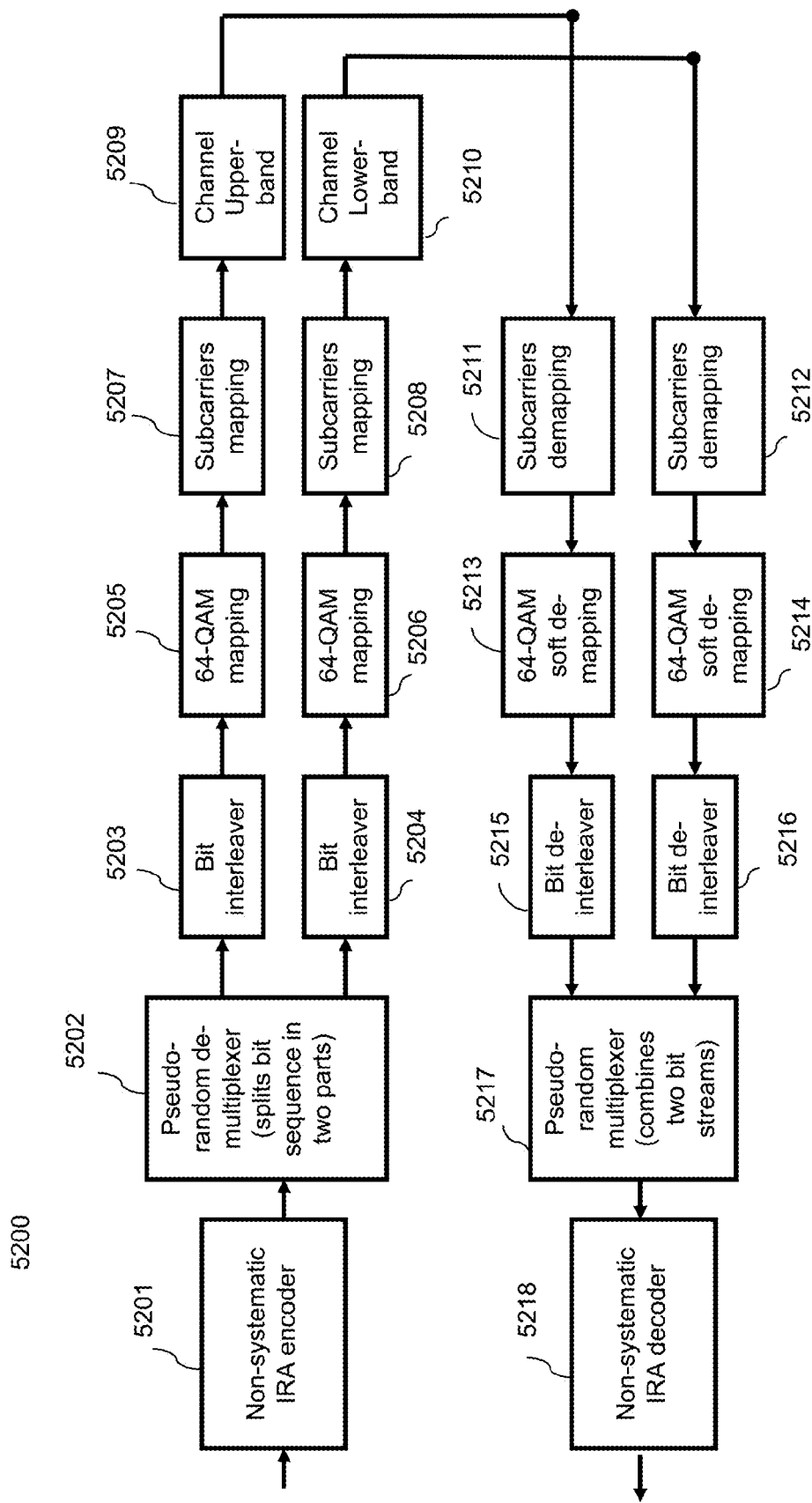
FIG. 12 is a block diagram depicting the use of check-irregular non-systematic IRA codes adapted for sidebands (upper/lower bands) transmission with 64-QAM in AM HD Radio digital broadcasting system in accordance with certain embodiments of the present invention.

In other embodiments, 64-QAM modulation is considered, as one of modulation schemes in all-digital or hybrid AM HD Radio system, as depicted in FIG. 12 in accordance with certain embodiments. For simplicity, other blocks of the HDR transmitter and receiver 5200 are omitted for simplicity of presentation. The information bits frame is encoded by check-irregular non-systematic IRA encoded in block 5201 as explained earlier, and then half coded bits are chosen randomly for upper band transmission in the pseudo-random demultiplexer block 5202 and the other half coded bits for lower band transmission. For each sideband, optional bit interleavers 5203-5204 are appended before 64-QAM mappers 5205-5206. Note that, in another embodiment, the bit interleaver 5203-5204 can be appended at the check-irregular non-systematic IRA encoder (5201) output and before the pseudo-random demultiplexing of coded bits in 5202 for upper/lower band transmission 5209/5210. After mapping of encoded bits to QAM symbols, a subcarrier mapping operation is performed in blocks 5207 and 5208 for each sideband before channel transmission. The IFFT/FFT blocks and other transmitter/receiver blocks that are commonly used in the art are omitted for simplicity of illustration.

The reverse operations are performed at the receiver for each sideband, namely, subcarriers demapping in 5211-5212, soft demapping of QAM symbols to coded bits LLRs in 5213-5214, and bit de-interleaving in 5215-5216. Multiplexer 5217 combines coded bit streams to restore the original order of bits before pseudo-random demultiplexing employed at the transmitter. Finally, the check-irregular non-systematic IRA decoder 5218 performs decoding and produces an estimate of transmitted message, as described in previous embodiments. In alternative embodiments, other modulation schemes could be used, e.g., 16-QAM, PSK, M-ary orthogonal modulation, etc. Also, the same or a similar arrangement could be used in other applications such as in dual macro diversity systems, e.g., dual satellite diversity as in Sirius/XM or similar systems. In other alternative embodiments, complementary code puncturing and code combining could be performed over more than two complementary streams.

In another embodiment, combined mapping and check-irregular non-systematic IRA encoding procedure can be done, such that the most protected bits of the modulation mapping 5205-5206 are assigned to degree 1 check nodes (i.e. check by-pass) and also to degree 2 and degree 3 repeat nodes. In this case, Hamming (8,4) code words could also be replaced by repeat 2 bit nodes.

In another embodiment, a mixture of different mapping constellations can be performed at the modulator 5205-5206, i.e. using constellation mapping 1 for a fraction of input bits and different constellation mapping 2 for the rest of input bits. Soft demappings are performed correspondingly at the receiver 5213-5214.

In yet another embodiment, the block bit interleavers 5203-5204 read input bits row-wise and output them column-wise. In yet another embodiment, the number of columns equal to 4 for 64-QAM yielded best performance.

Figure 13:
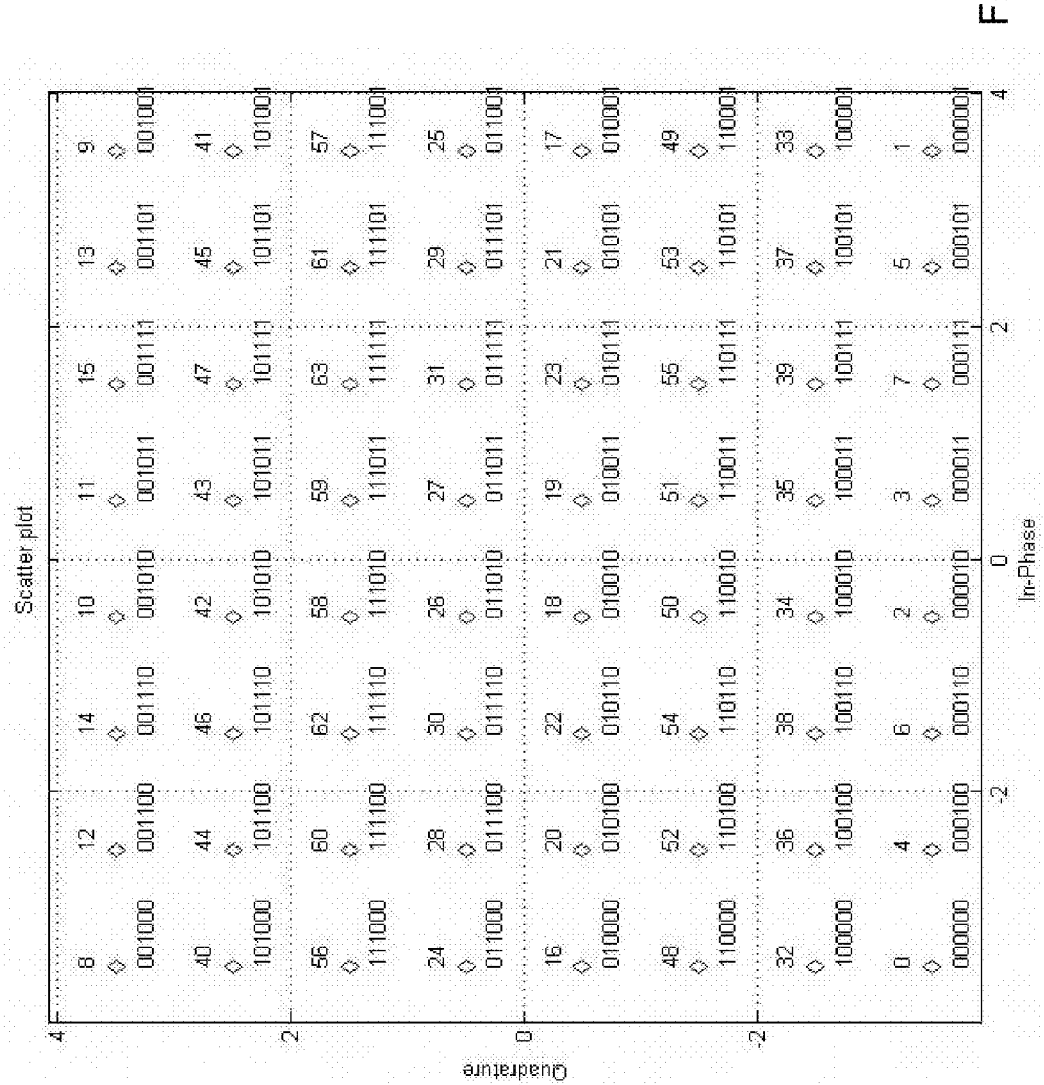
FIG. 13 depicts 64-QAM modulation mapping (MA3) used in AM HD Radio digital broadcasting system.
Figure 14A:
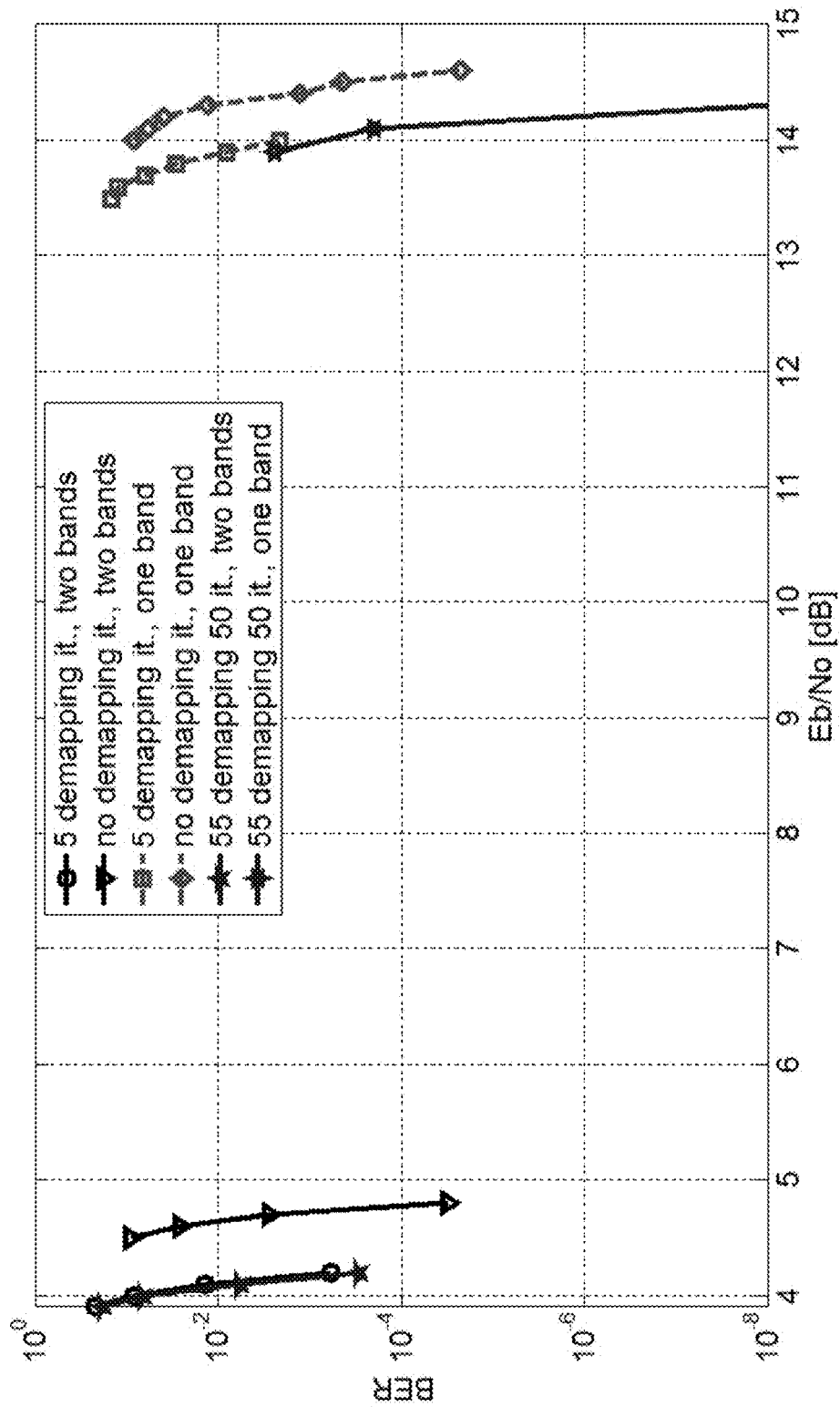
FIGS. 14A and 14B show the performance of check-irregular non-systematic IRA codes with one and both sidebands; 64-QAM (MA3), R=5/12, AWGN in accordance with certain embodiments of the present invention, where
Figure 14B:
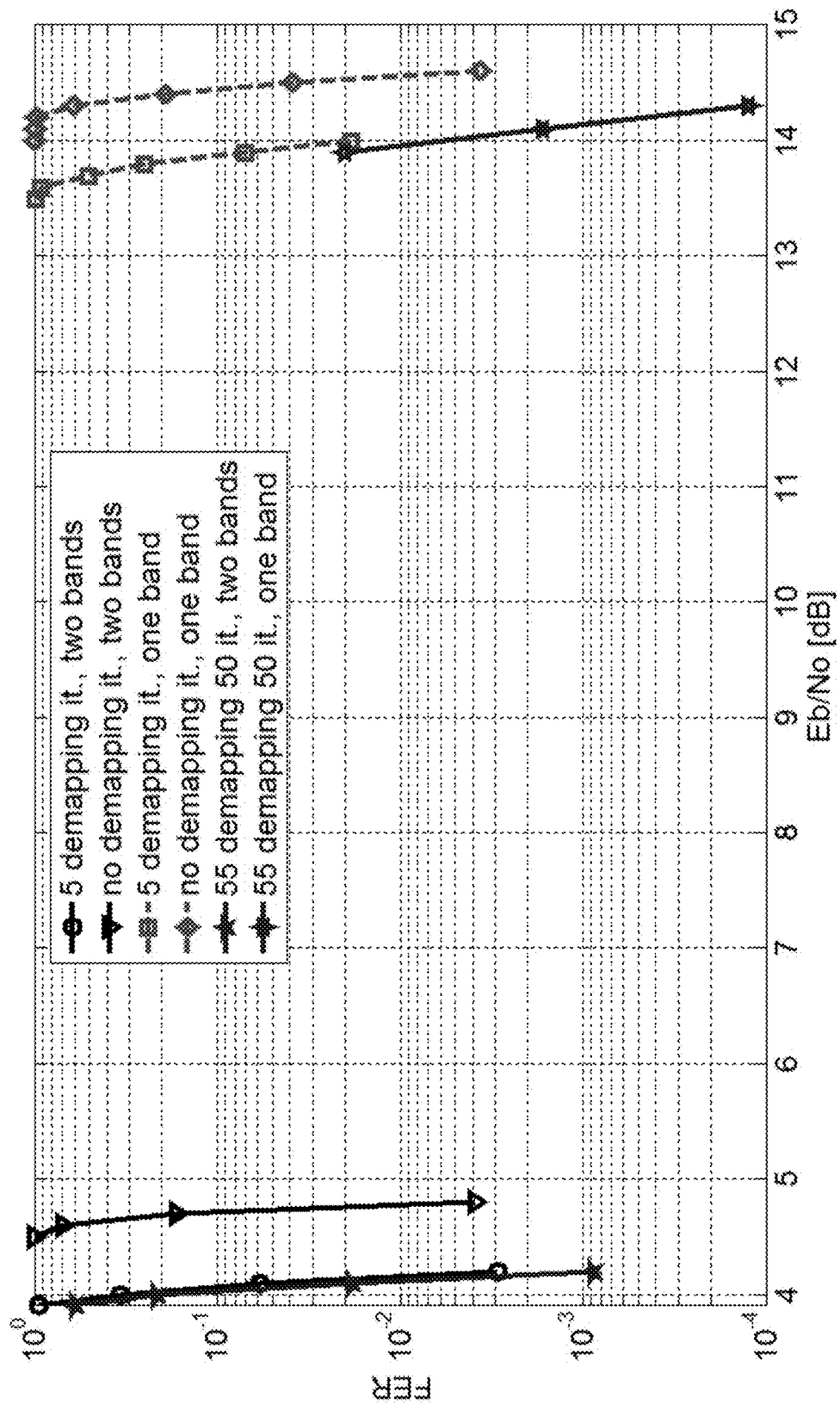

In one embodiment, AM MA3 mode 64-QAM mapping of AM HD Radio standard, as shown in FIG. 13, is employed in accordance with certain embodiments. The performance results for the non-systematic code of $R=5/12$ of certain embodiments when both sidebands are received and when only one sideband is received are shown in FIG. 14 in accordance with certain embodiments. It could be seen that the full rate code achieves very low BER/FER at Eb/No values of less than 4.3 dB while a complete loss of one sideband causes a degradation of about 10 dB; 3 dB is due to the loss of half the energy and the remaining 7 dB is due to the degraded code performance due to higher effective code rate. The loss of one side-band (half of coded bits) causes more degradation in 64-QAM case than in BPSK/QPSK case, but largely as could be predicted by corresponding Shannon capacity results. It should be noticed that FIG. 14 shows results for single initial de-mapping operation, i.e. no iterative demapping, 5 demapping operations (initial and after first four IRA decoding operations) and also 55 demapping operations (one initial demapping and four demappings between demapper and accumulator only, followed by one demapping after each complete check-irregular non-systematic IRA decoding iteration). It could be seen that it is advantageous to employ at least several iterative demapping iterations but there is a diminishing gain when going from 5 to 55 iterative demapping iterations. For best performance complexity tradeoff, it is advantageous to employ smaller number of demapping iterations than check-irregular non-systematic IRA decoding iterations, without a noticeable performance loss.

Figure 15A:
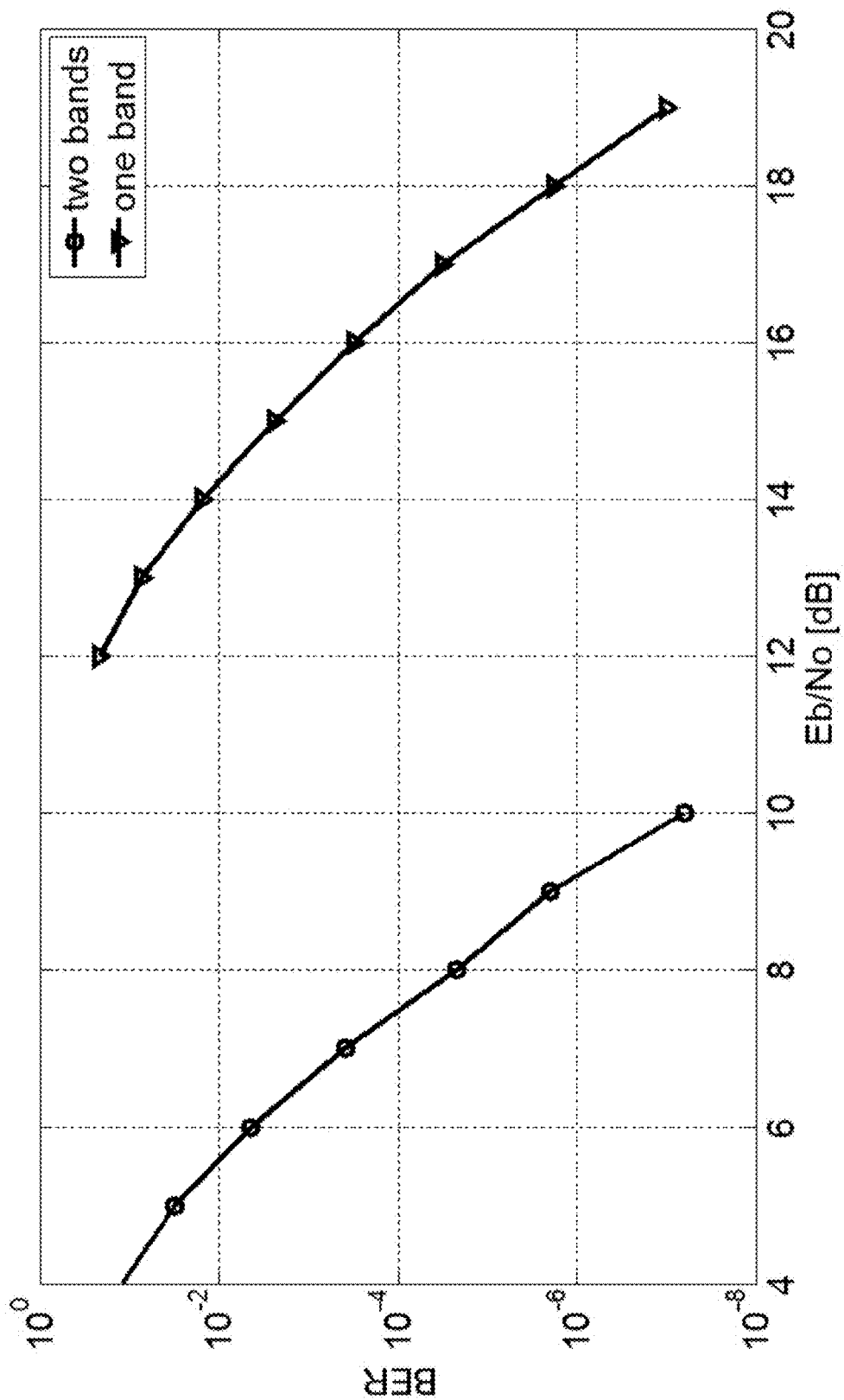
FIGS. 15A and 15B show the performance of convolutional codes of constraint length 9 with one and both sidebands; 64-QAM (MA3), R=5/12, AWGN in accordance with certain embodiments of the present invention, where
Figure 15B:
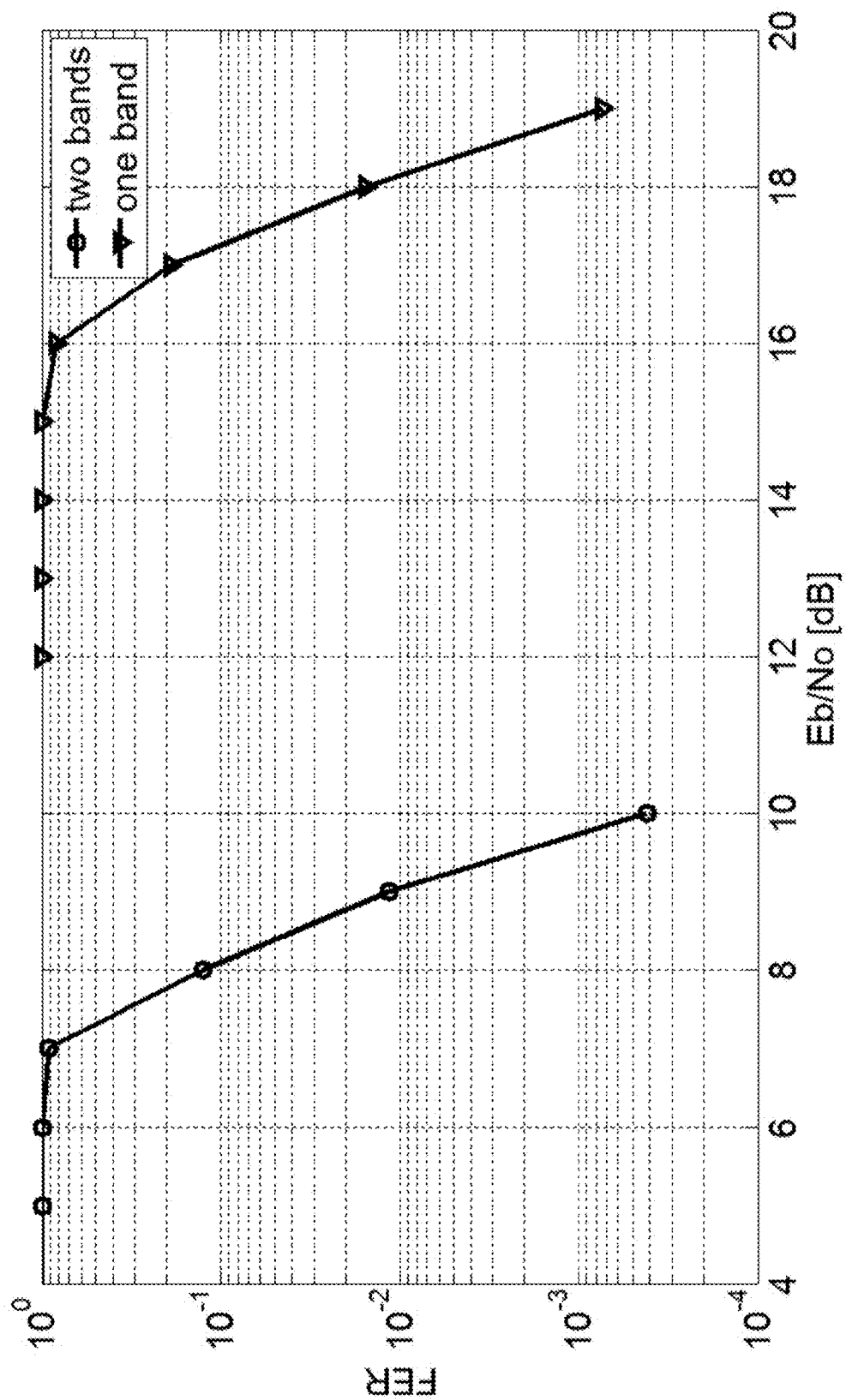

Corresponding results for a non-systematic convolutional code of constraint length 9 used in AM HD Radio are shown in FIG. 15 in accordance with certain embodiments. The generator polynomials for the convolutional code and the puncturing patterns to obtain R=5/12 code and rates R=5/6 codes are given in US Patent Publication 2003/0212946 as explained earlier in the context of the example for FIG. 11.

By comparing FER performance in FIG. 14 and in FIG. 15, at FER=10-3, one could see that the check-irregular non-systematic IRA code of this embodiment provides a gain of about 5.5 dB and 5 dB, respectively, for two side-bands and one side-band received, respectively, relative to the considered convolutional code. At lower FERs, which are preferable for broadcast applications, this performance gap would further increase in favor of the check-irregular non-systematic IRA code because it has a much steeper FER curve slope than the convolutional code.

Figure 16A:
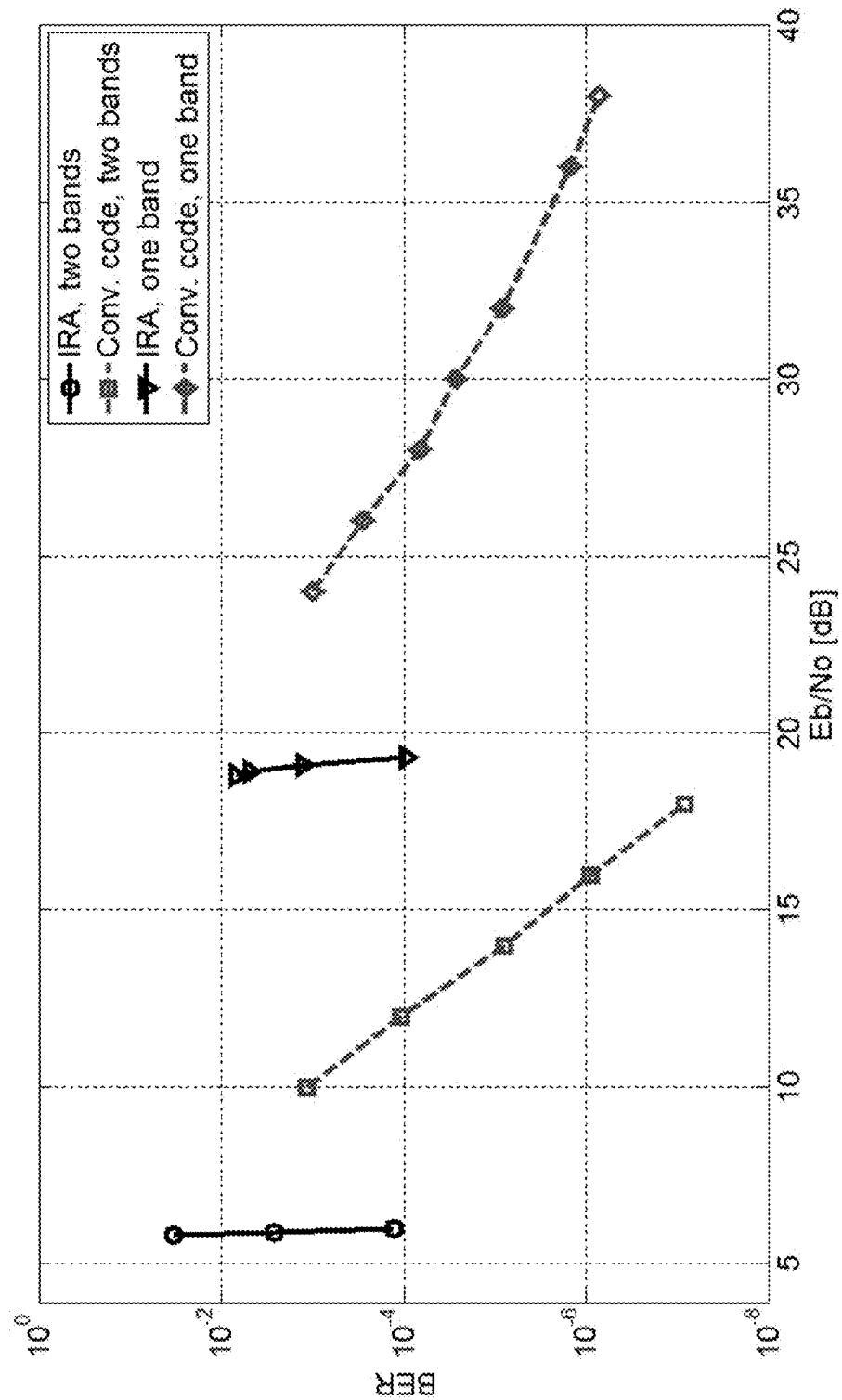
FIGS. 16A and 16B depict performance comparison of check-irregular non-systematic IRA codes used in certain embodiments of the present invention and convolutional codes in independent Rayleigh fading; 64-QAM (MA3), R=5/12, where
Figure 16B:
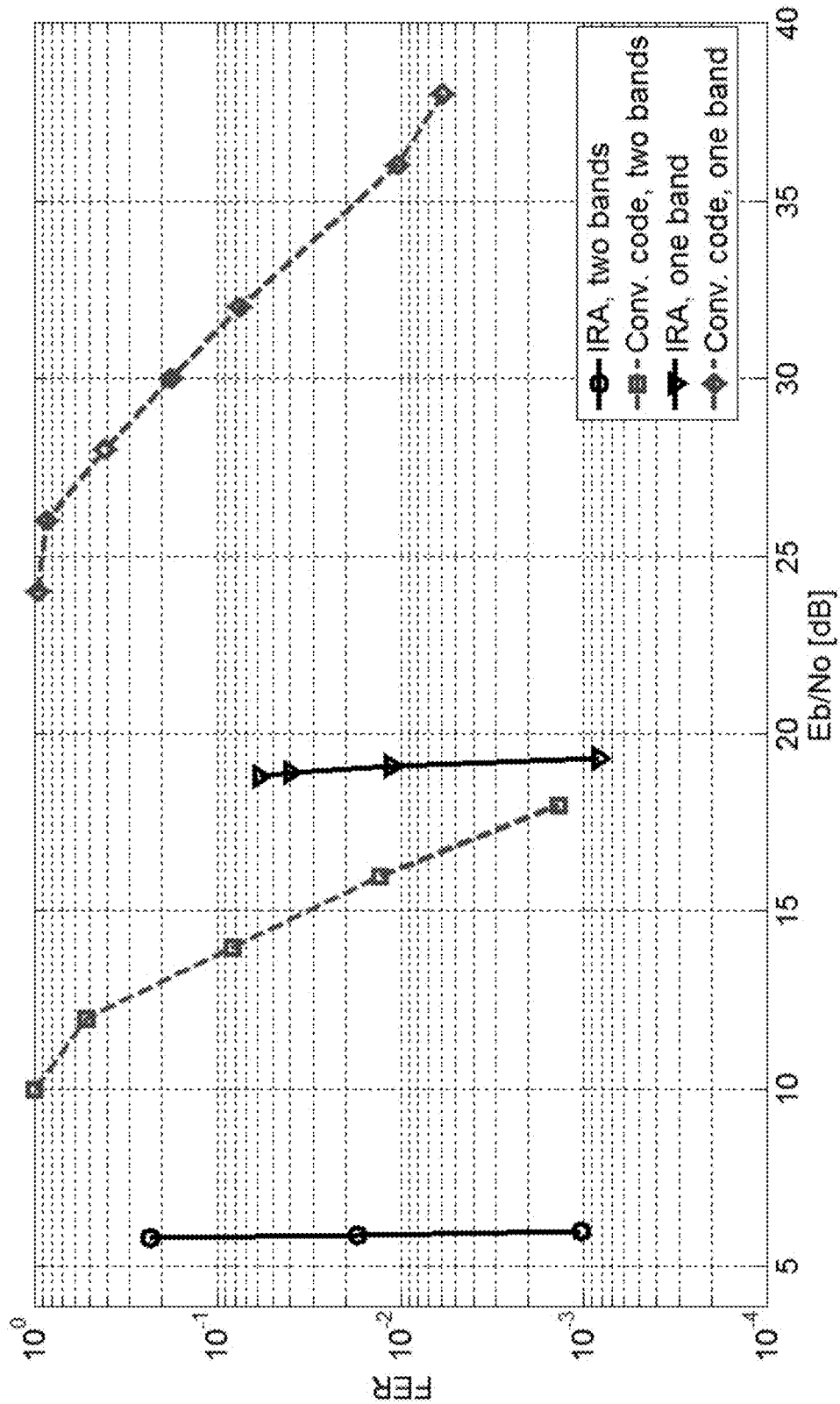

In FIG. 16, a performance comparison of the rate R=5/12 check-irregular non-systematic IRA code in accordance with certain embodiments is made in reference to the non-systematic convolutional code with the same parameters as in FIG. 14 and FIG. 14, except that independent Rayleigh fading is assumed in this case. 55 demapping operations (5 initial demapping iterations between demapper and accumulator only, followed by one demapping after each check-irregular non-systematic IRA decoding iteration) are employed, as it was observed by experimentation that more demapping iterations improve performance in fading channels. Still, it may be advantageous to skip demapping in some iterations to reduce complexity without noticeable performance loss. It could be seen in the fading case that the performance gain of the check-irregular non-systematic IRA code is even larger, specifically, about 12 dB when both side-bands are received and more than 20 dB when only one side-band is received. Even larger gains would be achieved in correlated multipath fading channels of practical interest.

Figure 17:
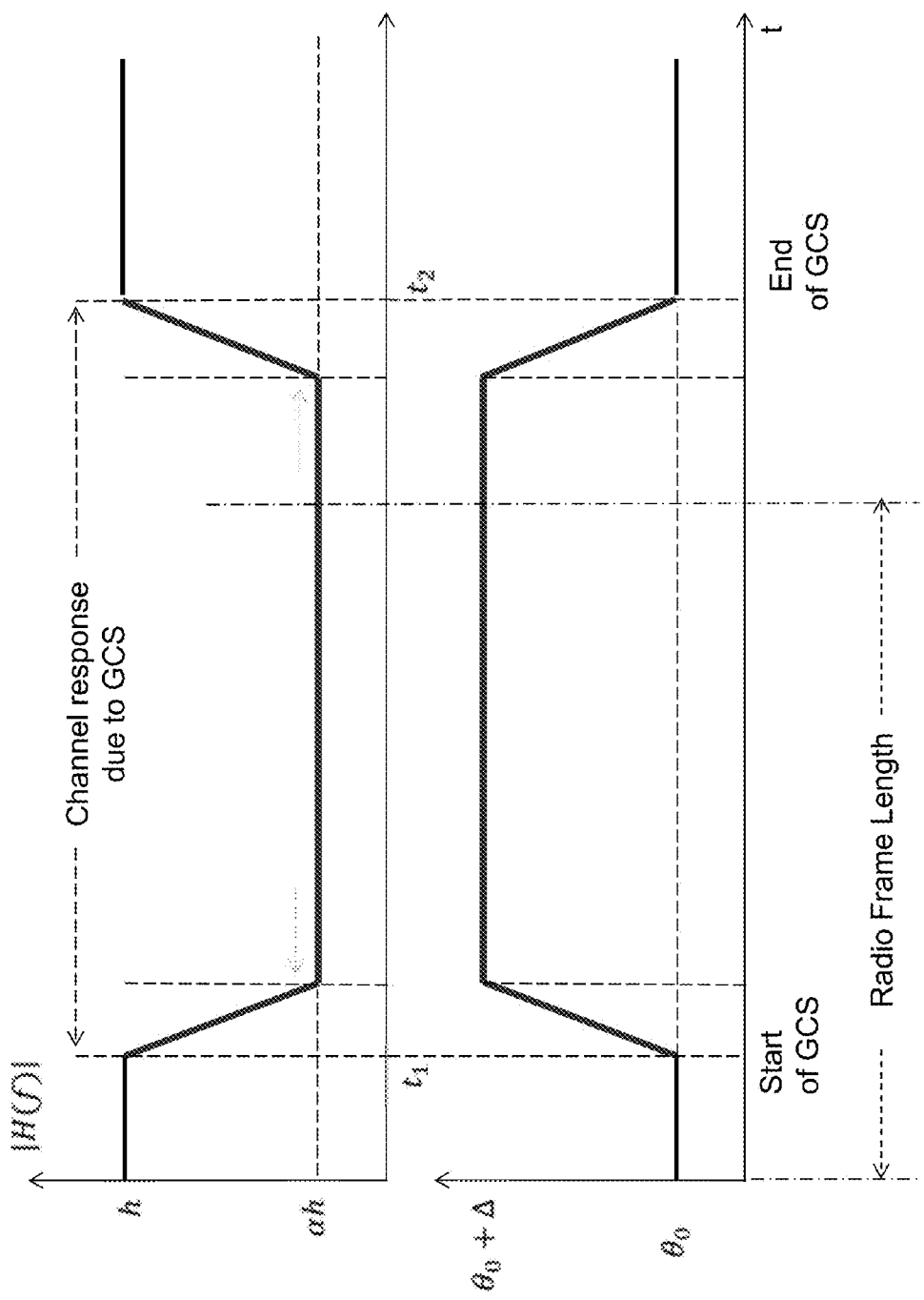
FIG. 17 depicts an example of channel response due to a ground conductive structure (GCS) for modeling AM HD Radio performance.

In another embodiment, AM HD Radio system is modeled more realistically by including, as a part of channel impairments, the impact of ground conductive structures (GGS), such as overpasses, bridges, power lines, and similar. An exemplary channel response due to a GCS is shown in FIG. 17, illustrating a sudden change of the channel response, due to the GCS such that the received signal could be significantly attenuated with simultaneous rapid phase change as well. To get specific performance results, it is assumed that the GCS may occur randomly with some probability and may last between 1.5 and 4.5 seconds when it does occur.

To increase time diversity and robustness in the presence of GCS, it is assumed that the check-irregular non-systematic IRA encoder in block 5201 of FIG. 12 produces a long packet comprising 8×31000 information bits. This packet length requires 8×256 contiguous OFDM symbols for transmission such that 8×6200 64-QAM symbols in blocks 5205 and 5206 of FIG. 12 are obtained for each upper/lower band. With a packet of such length the coding gain is improved, and, in addition, even in the presence of GCS of length up to 6 seconds, the packet could still be decoded at a sufficiently high SNR. Pilot symbols, referred to as "T" symbols in the HD Radio standard, are inserted approximately as in AM HDR standard, and subcarrier mapping done in blocks 5207 and 5208 of FIG. 12, so that 8×256 OFDM symbols, corresponding to the radio frame length, are formed for each upper/lower band channel transmission in blocks 5209 and 5210 of FIG. 12. It is assumed that 256 OFDM symbols correspond to time duration of approximately 1.5 seconds. Consequently, for GCS duration between 1.5 and 4.5 seconds, a packet of complementary punctured check-irregular non-systematic IRA code is affected by GSC on at most by 3×256 OFDM symbols for each of the upper and the lower bands. Thus, with these assumptions at most 3/8 of the coded bits of a packet may be lost in the worst case. Therefore, in the presence of random GCS occurrences, the effective code rate may vary between 5/12 and 2/3, which enables the IRA code to always converge in terms of achievable low error rate performance even in the case of GSC occurrences, although at somewhat higher SNR compared to the situations when the GCS is not affecting the signal.

For comparison, a non-systematic convolutional code is assumed as described earlier with puncturing patterns to obtain R=5/12 code and puncturing for upper and lower subbands as well as main and backup diversity subframes is implemented as in US Patent Publication 2003/0212946, which is incorporated by reference herein in its entirety. One convolutional code packet contains 31000 information bits, such that half of the coded bits are evenly split between main and backup subframes. Time diversity for the convolutional code is implemented such that the backup subframe starts 2×256 OFDM symbols (approximately 3 seconds) after the start of the main subframe, which accommodates maximum GCS duration of up to 3 seconds. 64-QAM modulation is employed and same pilot symbols structure is used as in the IRA embodiment described above.

Figure 18A:
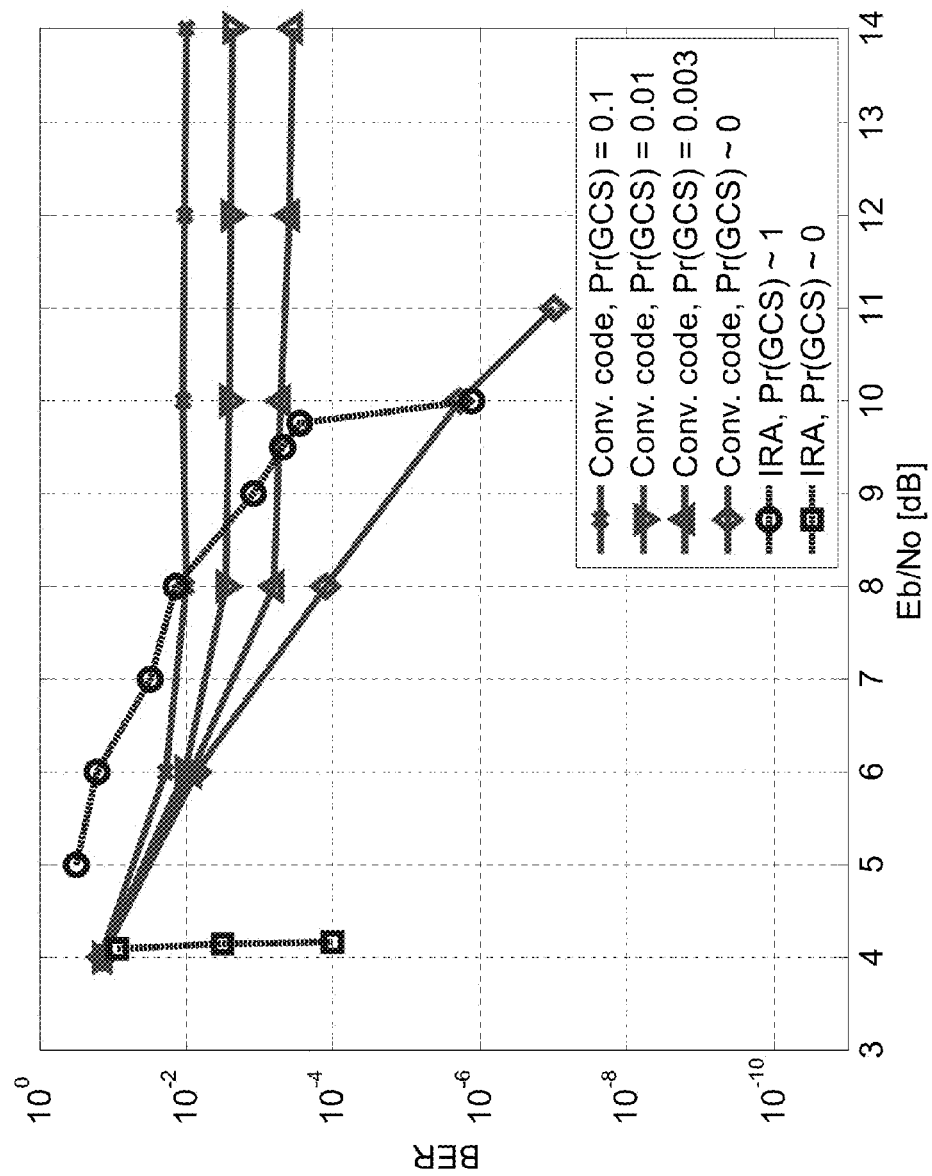
FIGS. 18A and 18B depict performance comparison of check-irregular non-systematic IRA code used in certain embodiments of the present invention and convolutional codes in AWGN channel in the presence of GCS occurring with different probabilities, employing 64-QAM and code rate R=5/12, where
Figure 18B:
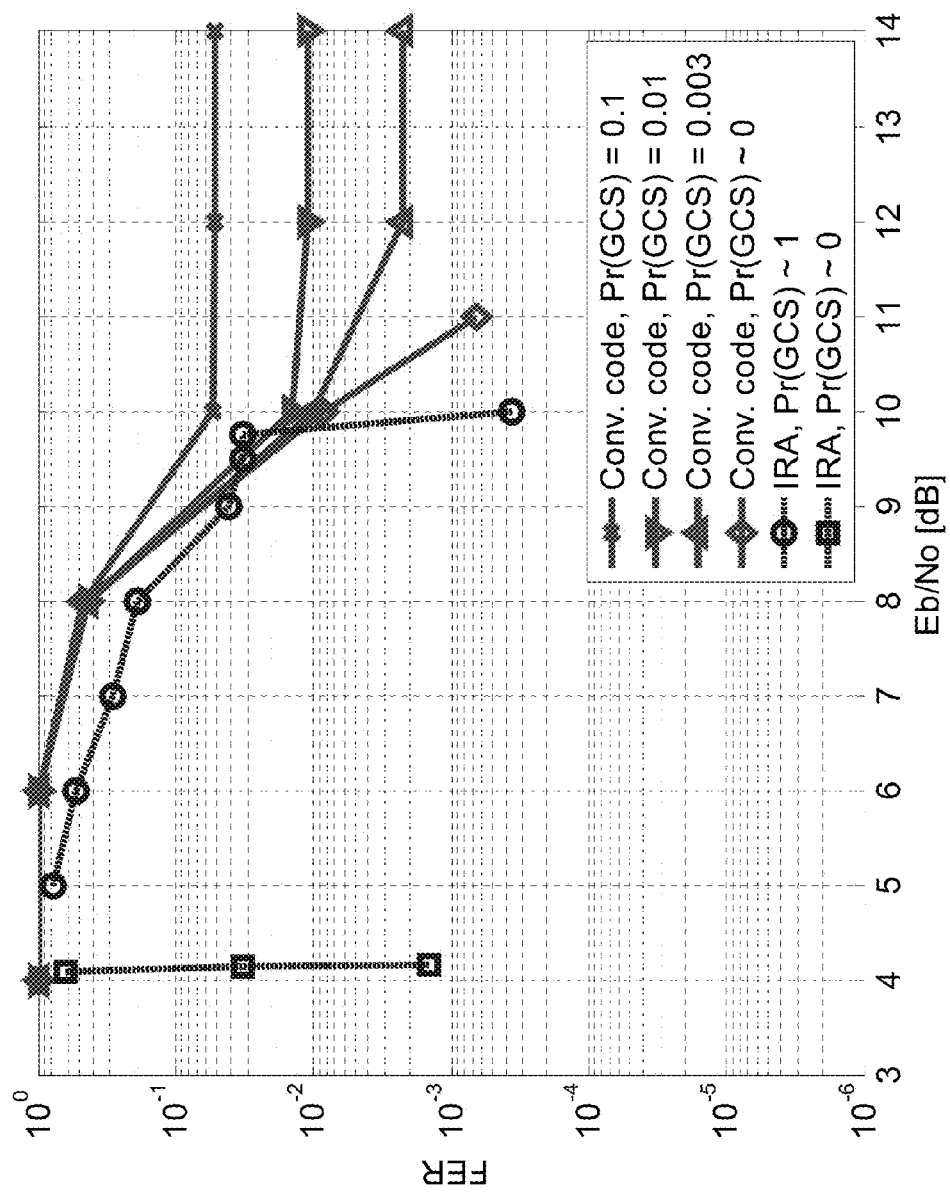

Performance comparison of the complementary punctured check-irregular non-systematic IRA code and non-systematic convolutional code in the presence of AWGN and different probabilities of GCS occurrence is depicted in FIG. 18. For the complementary punctured check-irregular non-systematic IRA code 5 demapping operations (initial and after first four IRA decoding operations) are employed. Initial CSI estimation is used for both non-systematic and complementary punctured check-irregular non-systematic IRA codes, employing the same algorithm. Initial and subsequent iterative channel estimation could be performed in accordance to the embodiments described in U.S. patent application Ser. No. 13/693,023 entitled Systems and Methods for Advanced Iterative Decoding and Channel Estimation of Concatenated Coding Systems, the contents of which are fully incorporated by reference herein in their entirety. FIGS. 18a and 18b show BER and FER performance curves, respectively, for the IRA and convolutional codes. The results in FIGS. 18a and 18b show that the complementary punctured check-irregular non-systematic IRA code of this embodiment shows a waterfall behavior, code convergence, at about 4.1-4.2 dB when no GCS is present (probability of GCS equal to 0) and at about 10 dB in the extreme case of probability of GCS being almost equal to 1. These two cases essentially bound the performance the IRA code for values of probability of GCS between 0 and 1. The convolutional code at FER about 0.001 shows about 7 dB of degradation as compared with the corresponding performance of the IRA code of this embodiment, for the case of probability of GCS equal to 0. With the probability of GCS taking the values 0.003, 0.01 and 0.1, the convolutional code exhibits error floors that are proportional to the corresponding probabilities of GCS occurrences.

Figure 19A:
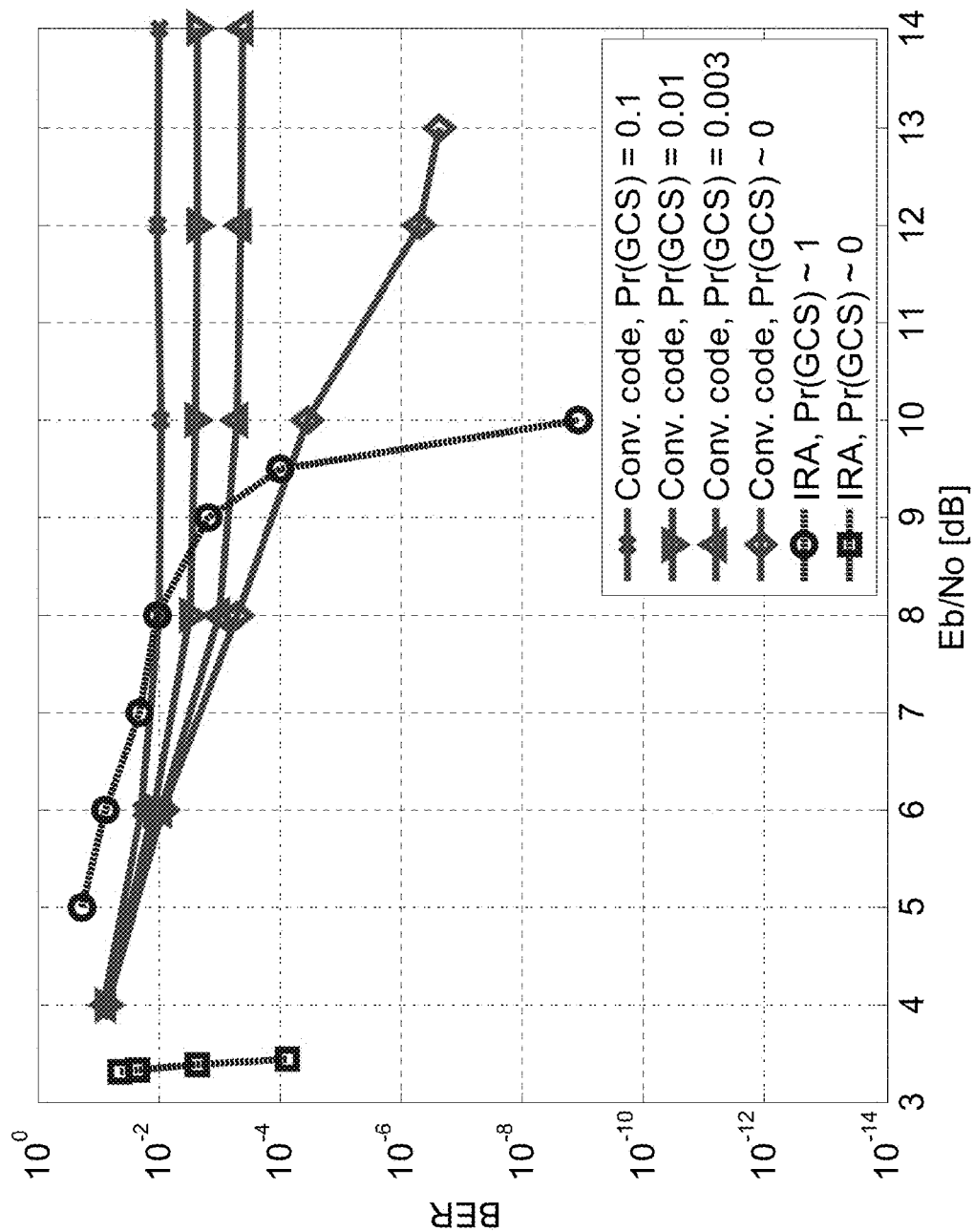
FIGS. 19A and 19B depict performance comparison of check-irregular non-systematic IRA code used in certain embodiments of the present invention and convolutional codes in Laplacian noise channel in the presence of GCS occurring with different probabilities, employing 64-QAM and code rate R=5/12, where
Figure 19B:
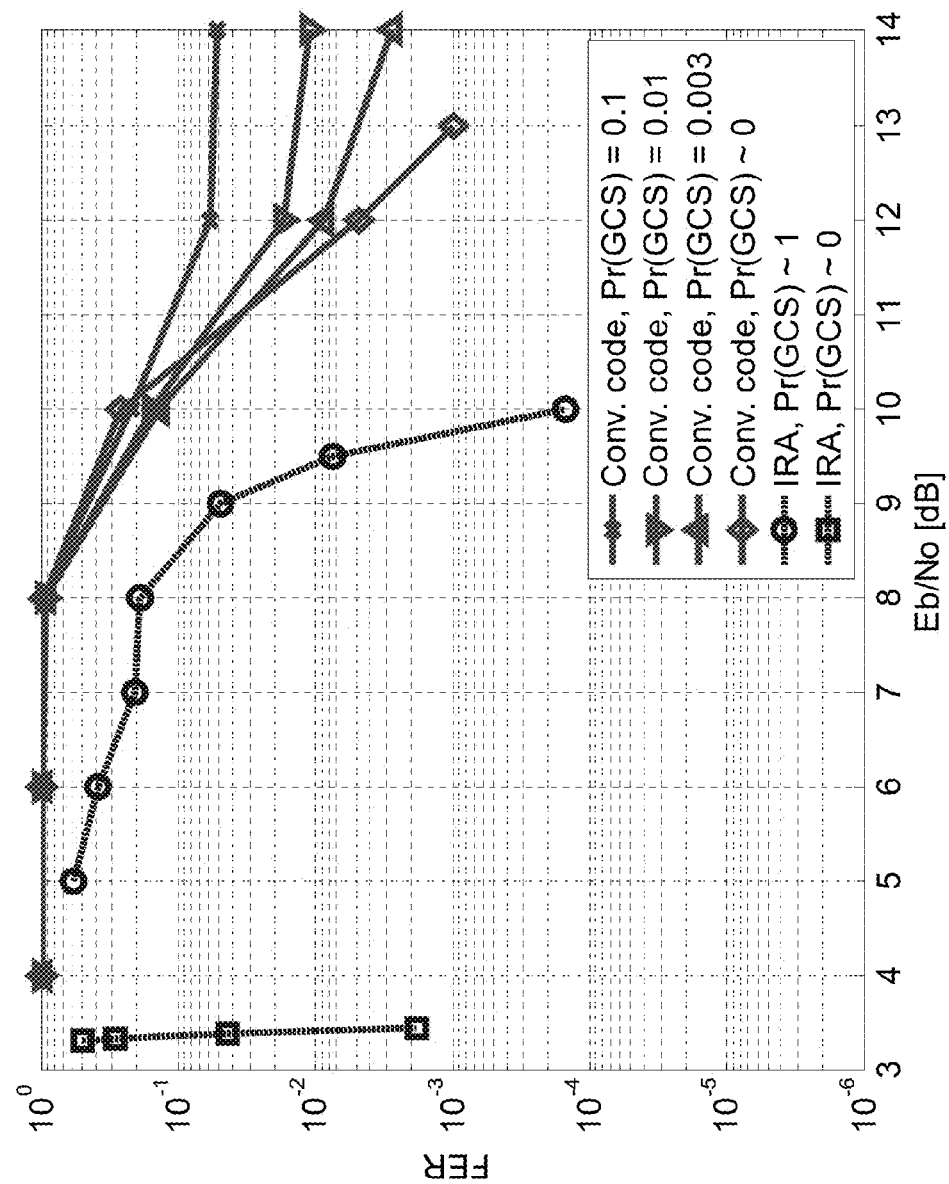

Similar performance comparison results are depicted in FIGS. 19a and 19b in the presence of Laplacian noise. Laplacian noise is used to model impulsive noise in AM scenarios. In this case, the demapper in block 5141 of FIG. 2 is modified to match with Laplacian noise distribution. That is, the channel LLRs of bits $x_k(i)$ in (3) take into account the conditional probability density function of received symbols, which is defined similar as in (4) as $$p(y_k \mid x_k) = \frac{1}{2b}\exp\left(-\frac{|y_k - A_k x_k|}{b}\right) \quad (21)$$

where $2b^2$ is the variance of the zero-mean Laplacian noise.

As shown in FIGS. 19*a* and 19*b*, the performance of complementary punctured check-irregular non-systematic IRA code improves relative to the AWGN case, while the performance of complementary punctured convolutional code degrades. Specifically, the waterfall regions for the complementary punctured check-irregular non-systematic IRA code are at about 3.5 and 10 dB, respectively, for the cases of probability of GCS equal to 0 and 1. At the same time, the FER for the convolutional code degrades by about 2 dB for the case of probability of GCS equal to 0. Thus, at the FER of about 0.001, the IRA code of this embodiment achieves performance gains of about 10 dB for the case of no GCS occurrence and larger degradation is expected at lower values of FER. Similarly, the convolutional code performance for the probability of GCS taking the values 0.003, 0.01 and 0.1 is also further degraded relative to the AWGN case. This is due to the impulsiveness of the Laplacian noise producing occasionally large, but erroneous, received channel LLR values which have detrimental effect on the cumulative path metric of convolutional Viterbi decoding. In contrast, the complementary punctured check-irregular non-systematic IRA code of this embodiment provides more robust decoding in the presence of Laplacian noise as the distribution of erroneous LLRs manifests differently on correct decoding of the check-irregular non-systematic IRA code. Specifically, for a given average noise power, in the Laplacian case, there would be a smaller number of erroneous LLRs but some erroneous LLRs may have larger magnitudes, compared to the AWGN case. The non-systematic check-irregular IRA decoder is better equipped to deal with such error distribution. This is due to in part because of additional clipping of large LLR values (by using a quantizer) at the output of the accumulator decoder, before passing the respective LLRs to the next decoding stage of the IRA decoder, which limits "error propagation" through the rest of the IRA decoder Furthermore, such less frequent errors resulting from large noise realizations are more readily corrected by the component decoders of the non-systematic check-irregular IRA decoder. For example, if an isolated error occurs on one of Hamming (8,4) codeword bit positions used in irregular repeater 5101 of FIG. 1 it can be readily corrected. Similarly, such errors could also be readily corrected by high degree bit-repeater decoders in 5101 of FIG. 1.

Figure 20A:
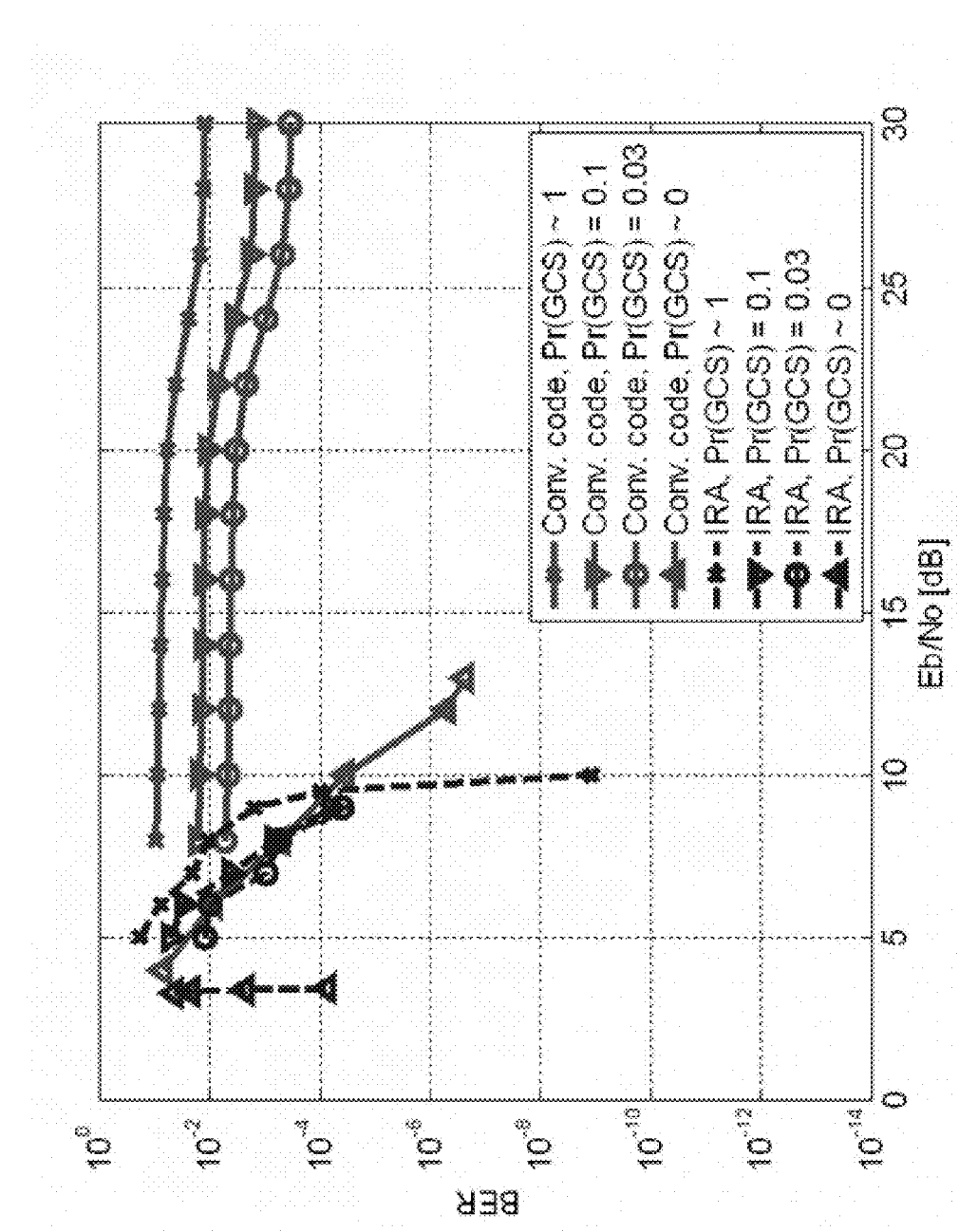
FIGS. 20A and 20B depict performance comparison of check-irregular non-systematic IRA code used in certain embodiments of the present invention and convolutional codes in Laplacian noise channel in the presence of GCS occurring with different probabilities, employing 64-QAM and code rate R=5/12, where
Figure 20B:
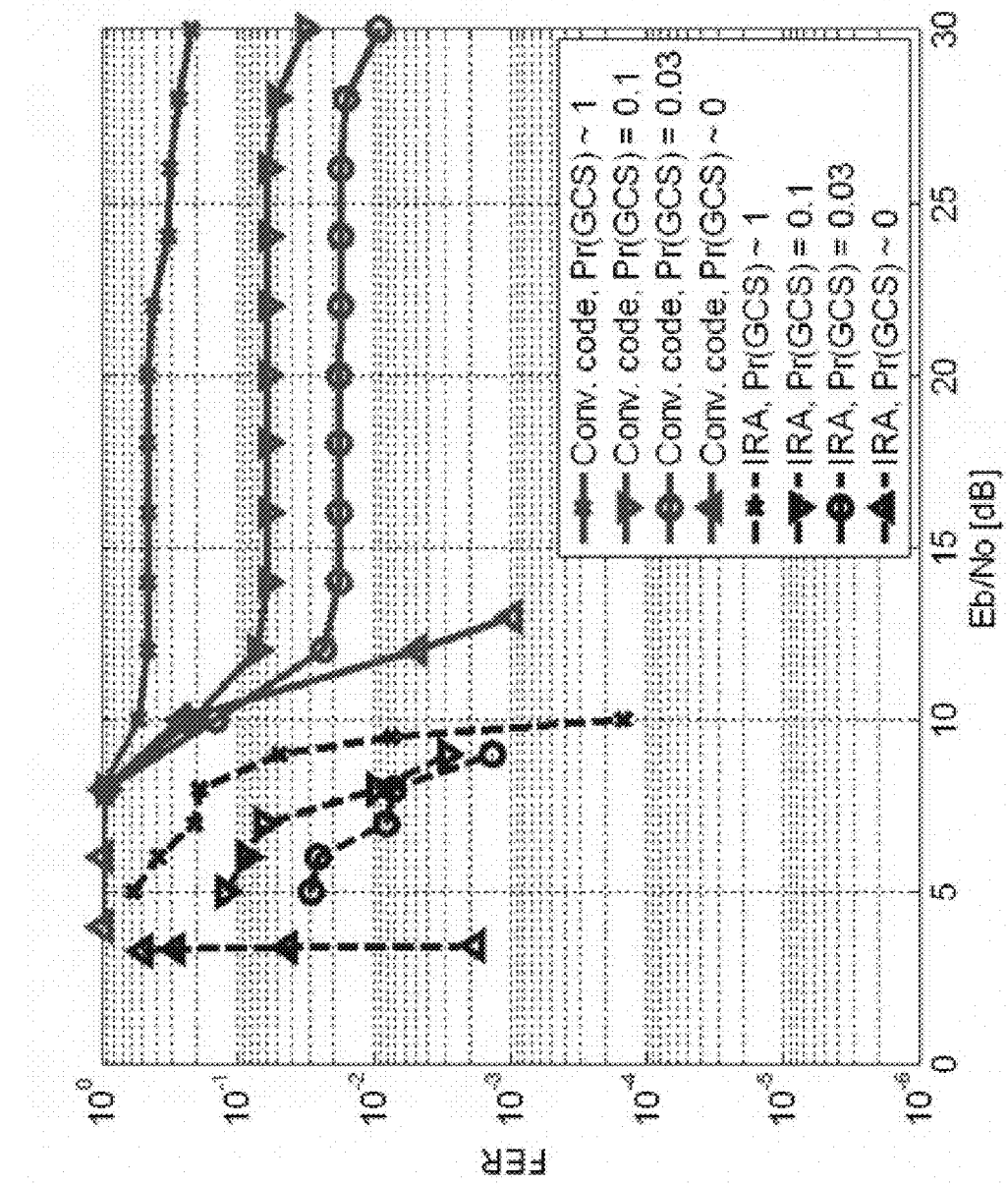

FIGS. 20*a* and 20*b* depict similar performance comparison results as in FIGS. 19*a* and 19*b*, respectively, but increasing the transmit time diversity for the non-systematic convolutional code to 4.5 seconds as in HDR standard. Time diversity is implemented such that the backup subframe starts 3×256 OFDM symbols (approximately 4.5 seconds) after the start of the main subframe, and such diversity delay accommodates maximum GCS duration of up to 4.5 seconds with coded bits not affected by GCS being uniquely decodable. The convolutional code performance for the probability of GCS taking the values 0.03, 0.1 and 1 exhibits error floors that are proportional to the corresponding probabilities of GCS occurrences. It appears that for EbNo values beyond 30 dB, the convolutional code may start to show declining BER and FER but this range is out of practical interest as it would make the coverage very small. The IRA code of this embodiment shows a waterfall behavior as before, and achieves significant performance gains with respect to the non-systematic convolutional code and for the same values of GCS. In other embodiments, non-uniform M-QAM constellations are employed to approximate better Gaussian alphabet. The performance of the non-systematic check-irregular IRA code is further improved with non-uniform 64-QAM.

It has been demonstrated that the novel check-irregular non-systematic IRA code according to certain embodiments could offer significant performance gain in AM and FM HD Radio systems, and also in other systems where a non-systematic code is desirable for the reasons discussed previously.

In other embodiments, multiple receive antennas may be employed. The receiver system in FIG. 3 would be adopted such that demapper 5141 is a vector demapper, as known in the art. The term "vector demapper" signifies that with N antennas the demapper 5141 performs bit LLR calculations using N distorted, noisy replicas as received by N antennas, of the same transmitted modulation symbol. Similarly, in the system in FIG. 12, demappers 5213-5214 would be adopted to process noisy symbol replicas received by multiple antennas. The vector demappers could be adopted to perform either equal-gain or maximal-likelihood combining. In a special case, the said demappers could be adopted to select the best antenna signal and operate on a single symbol afterwards, just as in a single antenna system. Alternatively, antenna selection circuitry somewhere before the demapper could provide individual symbols to the demapper/s.

In one embodiment, the system in FIG. 8 could be adapted for frequency or time and space diversity. At time t1, complementary code 1 in 5183 could be transmitted on antenna 1 (not shown) on a given carrier frequency and frequency band, while complementary code 2 in 5184 could be transmitted on antenna 2 (not shown) on the same carrier frequency and frequency band. If time diversity is added, than at time t2, separated from t1 to provide sufficient time diversity, the complementary codes 1 and 2 in 5183-5184 respectively will be transmitted on antennas 2 and 1, respectively. In other embodiments, more than two codes and antennas could be employed.

In other embodiments, complementary punctured codes obtained from the check-irregular non-systematic IRA code of certain embodiments could be advantageously used for transmit diversity in MISO and MIMO systems. With N≥2 transmit antennas, a sufficiently low rate non-systematic codes is complementary punctured into N complementary codes 1, . . . , N such that complementary code 1 is transmitted from antenna 1, complementary code 2 from antenna 2, etc. Signal carrying these complementary codes occupy same frequency band, or partially overlapping frequency bands. To facilitate efficient separation of signals from different antennas at the receiver, each antenna would transmit a unique known signal that will enable the receiver to estimate the channel response matrix between different transmit and receive antennas. The estimated channel response matrix can then be used for separating signals from different antennas by using Zero-Forcing or MMSE linear detector, or Maximum Likelihood detector, or other detectors known in the art. After symbol streams corresponding to different transmit antennas and complementary codes are separated, they are combined to yield full check-irregular non-systematic IRA code as before puncturing, wherein some of the complementary code bits may experience different fading. The use of check-irregular non-systematic IRA code with complementary puncturing may provide better performance than typically used MIMO transmit diversity schemes, e.g., such as space-time block coding.

In other embodiments, complementary punctured check-irregular non-systematic IRA code is employed in HARQ systems. Without loss of generality, consider a HARQ system with up to 4 transmissions. A low rate IRA code such that R<¼, say R=⅕, is punctured into four complementary codes of code rate R=⅘. In the first transmission complementary code 1 is transmitted. If the first transmission is not successful, the $2^{nd}$ transmission will carry complementary code 2 bits, which when combined with the $1^{st}$ transmission in the receiver will yield rate R=4/10, thus in addition to additional energy and diversity gain there would be additional maximum possible coding gain. If the packet is not decoded even after $2^{nd}$ transmission, the $3^{rd}$ transmission will include complementary code 3, which after combining with first two transmissions in the receiver will yield a rate R=4/15 with a corresponding gain, plus energy and diversity gain as mentioned earlier. Likewise, if the packet is still not decoded correctly, the $4^{th}$ transmission will include complementary code 4, thus providing maximum coding gain corresponding to rate R=4/20=⅕ of the full check-irregular non-systematic IRA code. This approach is known in the art as incremental redundancy HARQ, but in prior art systems incremental redundancy HARQ includes repetition of at least some coded bits that were previously transmitted, due to the systematic nature of employed codes, thus providing smaller code combining gain.

While there have been shown and described various novel features of the invention as applied to particular embodiments thereof, it will be understood that various omissions and substitutions and changes in the form and details of the systems and methods described and illustrated, may be made by those skilled in the art without departing from the spirit of the invention. Those skilled in the art will recognize, based on the above disclosure and an understanding therefrom of the teachings of the invention, that the particular hardware and devices that are part of the invention, and the general functionality provided by and incorporated therein, may vary in different embodiments of the invention. Accordingly, the particular system components and results shown in FIG. 1-FIG. 20 are for illustrative purposes to facilitate a full and complete understanding and appreciation of the various aspects and functionality of particular embodiments of the invention as realized in system and method embodiments thereof. Those skilled in the art will appreciate that the invention can be practiced in other than the described embodiments, which are presented for purposes of illustration and not limitation, and the present invention is limited only by the claims which follow.

What is claimed is:

1. A system for encoding check-irregular non-systematic irregular repeat accumulate codes, the system comprising:
   at least one information bit repeater having an irregular degree N, wherein the at least one information bit repeater produces a different number of N identical replicas of information bits, the at least one information bit repeater producing a first set of coded bits;
   an interleaver coupled to the at least one information bit repeater and configured to interleave the first set of coded bits and produce a second set of coded bits;
   a set of check node combiners of different degrees coupled to the interleaver, wherein a check node combiner with a degree M greater than or equal to 2 performs modulo 2-addition on M information bits, and a check node combiner with a degree M equal to 1 bypasses the modulo 2-addition, wherein the set of check node combiners receives the second set of coded bits from the interleaver and produces a third set of coded bits; and
   a convolutional encoder coupled to the set of check node combiners and configured to generate a check-irregular non-systematic irregular repeat accumulate code by receiving and encoding the third set of coded bits, wherein the encoded third set of coded bits is the check-irregular non-systematic irregular repeat accumulate code.

2. The system of claim 1 wherein the set of check node combiners has at least one check node combiner of degree greater or equal than 2 and at least one bypass check node combiner with a degree equal to 1.

3. The system of claim 1 wherein the at least one information bit repeater is replaced by code words of a linear block code of rate R.

4. The system of claim 3 wherein the linear block code is of rate 1/2.

5. The system of claim 4 wherein the linear block code is a rate 1/2 linear block code encoder comprising a Hamming (8,4) encoder.

6. The system of claim 1 including an outer encoder that encodes at least some information bits $\{d_i\}$ into bits $\{u_i\}$ before the encoding of the first set of coded bits in the encoder.

7. The system of claim 6 wherein the outer encoder comprises an accumulator encoder that processes said bits $\{d_i\}$ into bits $\{u_i\}$ according to the following formula:

$$u_1=d_1, u_i=d_i \oplus u_{i-1}, i=2,3,4 \ldots$$

where $\oplus$ represents modulo-2 addition.

8. The system of claim 6 wherein the outer encoder comprises a single parity check (SPC) encoder that processes said bits $\{d_i\}$ into bits $\{u_i\}$ according to the following formula:

$$u_i=d_i, i=1,2,\ldots,K, u_{K+1}=d_1 \oplus d_2 \oplus \ldots \oplus d_{K-1} \oplus d_K$$

where $\oplus$ represents modulo-2 addition.

9. The system of claim 6 wherein the outer encoder comprises a cyclic forward error correction encoder that processes K said bits $\{d_i\}$ into N bits $\{u_i\}$.

10. A system for encoding check-irregular non-systematic irregular repeat accumulate codes with complementary puncturing, the system comprising:
   a check-irregular non-systematic irregular repeat accumulate code produced as the output from the convolutional encoder of the system in claim 1; and
   a demultiplexer to partition the check-irregular non-systematic irregular repeat accumulate code from the accumulator output into two or more sets of complementary coded bits, wherein each set of complementary coded bits is transmitted over a sub-channel.

11. The system of claim 10 wherein each of the sub-channels of complementary coded bits are configured to be recombined and jointly decoded.

12. The system of claim 10 further including one or more bit interleavers in between the convolutional encoder and one or more symbol mappers.

13. The system of claim 12 wherein the one or more bit interleavers are rectangular interleavers, with different number of rows and columns.

14. The system of claim 12 wherein the one or more symbol mappers are different, such that a subset of symbols are produced with different symbol mappings.

15. The system of claim 12 wherein some bit positions in the M-ary symbol constellations of said one or more symbol mappers are more reliable and wherein the third set of coded bits dependent on the coded bits coming from the check node by-pass are prioritized to be placed onto said more reliable bit positions of the said M-ary symbol constellations.

16. The system of claim 15 wherein the bits going through the check node by-pass are further prioritized to emanate from bit nodes with smaller degrees.

17. A system for encoding check-irregular non-systematic irregular repeat accumulate codes, the system comprising:

a first encoder that receives a series of information bits and produces a first series of coded bits comprising of identical replicas of the series of information bits based on a set of degrees, wherein each degree determines a repetition number for the series of information bits;

an interleaver coupled to the first encoder that interleaves the first series of coded bits and produces a second series of coded bits; and a second encoder coupled to the interleaver and configured to generate a check-irregular non-systematic irregular repeat accumulate code by receiving the second series of coded bits and producing a third series of coded bits based on bit differences among the second series of coded bits, wherein the third series of coded bits is the check-irregular non-systematic irregular repeat accumulate code.

18. The system of claim 17 further comprising a set of check node combiners of different degrees that receive the second series of coded bits and are coupled to the differential encoder, wherein a check node combiner with a degree M greater than or equal to 2 performs modulo 2-addition on M information bits and a check node combiner with a degree M equal to 1 bypasses the modulo 2-addition.

19. The system of claim 17 further comprising an outer encoder that encodes at least some information bits before the encoding of the first series of coded bits in the encoder.

* * * * *